United States Patent
Hayano

(10) Patent No.: US 12,133,454 B2
(45) Date of Patent: Oct. 29, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-Si (KR)

(72) Inventor: Tetsuji Hayano, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 299 days.

(21) Appl. No.: 16/575,334

(22) Filed: Sep. 18, 2019

(65) Prior Publication Data
US 2020/0144503 A1     May 7, 2020

(30) Foreign Application Priority Data
Nov. 6, 2018    (KR) ........................ 10-2018-0135437

(51) Int. Cl.
    *H01L 51/00*       (2006.01)
    *C07F 5/02*        (2006.01)
                (Continued)

(52) U.S. Cl.
    CPC ........... *H10K 85/322* (2023.02); *C07F 5/027* (2013.01); *C09K 11/06* (2013.01);
                (Continued)

(58) Field of Classification Search
    CPC ............... H01L 51/008; H01L 51/5016; H01L 51/5012; C07F 5/027; C09K 11/06; C09K 2211/1022; H10K 85/322; H10K 85/636
See application file for complete search history.

(56) References Cited

U.S. PATENT DOCUMENTS

2003/0044640 A1 *   3/2003   Funahashi ............ H10K 85/633
                                                  564/429
2018/0094000 A1     4/2018   Hatakeyama et al.
(Continued)

FOREIGN PATENT DOCUMENTS

JP              5935199 B2     6/2016
JP         2017-126606 A     7/2017
(Continued)

*Primary Examiner* — Alexander C Kollias
(74) *Attorney, Agent, or Firm* — Lewis Roca Rothgerber Christie LLP

(57) ABSTRACT

An organic electroluminescence device includes a first and electrodes, sandwiching the following layers: a hole transport region disposed on the first electrode, an emission layer disposed on the hole transport region, an electron transport region disposed on the emission layer. The emission layer includes a polycyclic compound represented by the following structure:

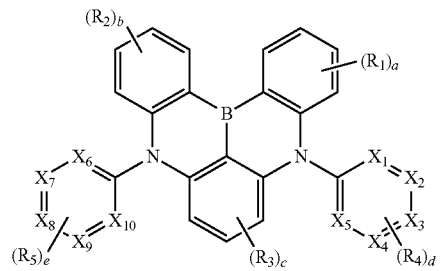

wherein each of $X_1$ to $X_{10}$ is independently carbon or nitrogen, and each of $R_1$ to $R_5$ is independently a hydrogen atom, a deuterium atom, a substituted or unsubstituted amine group, a substituted or unsubstituted aryl group of 6 to 30 carbon atoms for forming a ring, or a substituted or unsub- (Continued)

stituted heteroaryl group of 2 to 30 carbon atoms for forming a ring. If all $X_1$ to $X_{10}$ are carbon, at least one of $R_4$ and $R_5$ is a substituted or unsubstituted heteroaryl group of 2 to 30 carbon atoms for forming a ring.

7 Claims, 2 Drawing Sheets

(51) Int. Cl.
*C09K 11/06* (2006.01)
*H10K 85/30* (2023.01)
*H10K 50/11* (2023.01)
*H10K 101/10* (2023.01)

(52) U.S. Cl.
CPC ...... *C09K 2211/1022* (2013.01); *H10K 50/11* (2023.02); *H10K 2101/10* (2023.02)

(56) References Cited

U.S. PATENT DOCUMENTS

| | | |
|---|---|---|
| 2018/0301629 A1 | 10/2018 | Hatakeyama et al. |
| 2018/0366653 A1 | 12/2018 | He et al. |
| 2019/0058124 A1* | 2/2019 | Hatakeyama ......... H01L 51/008 |
| 2020/0035922 A1 | 1/2020 | Ogiwara et al. |
| 2021/0053998 A1* | 2/2021 | Kim .................... H10K 85/6576 |
| 2021/0277026 A1* | 9/2021 | Geum ................... C07B 59/004 |

FOREIGN PATENT DOCUMENTS

| | | |
|---|---|---|
| KR | 10-2017-0130434 A | 11/2017 |
| KR | 10-2017-0130435 A | 11/2017 |
| KR | 10-1876763 B1 | 7/2018 |
| KR | 10-1886773 B1 | 8/2018 |
| KR | 10-1990818 B1 | 6/2019 |
| KR | 10-2020-0011383 A | 2/2020 |
| KR | 10-2020-0019272 A | 2/2020 |
| WO | 2015/102118 A1 | 7/2015 |
| WO | 2016/152418 A1 | 9/2016 |
| WO | 2017/092508 A1 | 6/2017 |
| WO | 2017/188111 A1 | 11/2017 |
| WO | WO 2018/181188 A1 | 10/2018 |
| WO | WO 2019/235402 A1 | 12/2019 |
| WO | WO 2020/022751 A1 | 1/2020 |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATIONS

This U.S. non-provisional patent application claims priority under 35 U.S.C. § 119 from Korean Patent Application No. 10-2018-0135437, filed on Nov. 6, 2018, the entire content of which is hereby incorporated by reference.

BACKGROUND

The present disclosure herein relates to an organic electroluminescence device and a polycyclic compound used in the organic electroluminescence device.

Recently, much effort is dedicated to development of an organic electroluminescence display device as an image display device. Unlike a liquid crystal display device, the organic electroluminescence display device is a self-luminescent display device in which holes and electrons injected from a first electrode and a second electrode recombine in an emission layer. The emission layer includes a light emission material including an organic compound, and emits light to display images.

In the application of an organic electroluminescence device to a display device, a lower driving voltage, an increased emission efficiency and a longer life of the organic electroluminescence device are desired. Hence, research and development on materials for an organic electroluminescence device capable of stably attaining those characteristics are ongoing.

Particularly, recently, in order to accomplish an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

SUMMARY

The present disclosure provides an organic electroluminescence device having long lifespan and high efficiency, and a polycyclic compound used therein.

The present disclosure also provides an organic electroluminescence device including a material for emitting thermally activated delayed fluorescence, and a polycyclic compound used as a material for emitting thermally activated delayed fluorescence.

An embodiment of the inventive concept provides an organic electroluminescence device including a first electrode, a hole transport region disposed on the first electrode, an emission layer disposed on the hole transport region, an electron transport region disposed on the emission layer, and a second electrode disposed on the electron transport region, wherein the emission layer includes a polycyclic compound represented by the following Formula 1:

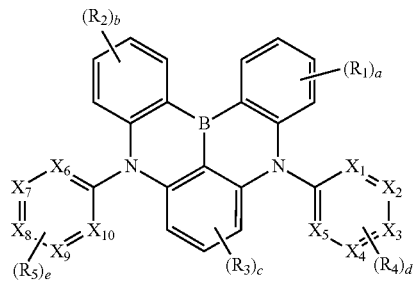

[Formula 1]

In Formula 1, $X_1$ to $X_{10}$ are each independently carbon or nitrogen, $R_1$ to $R_5$ are each independently a hydrogen atom, a deuterium atom, a substituted or unsubstituted amine group, a substituted or unsubstituted aryl group of 6 to 30 carbon atoms for forming a ring, or a substituted or unsubstituted heteroaryl group of 2 to 30 carbon atoms for forming a ring, "a" and "b" are each independently an integer of 0 to 4, "c" is an integer of 0 to 3, and "d" and "e" are each independently an integer of 0 to 5, wherein if all $X_1$ to $X_{10}$ are carbon, at least one among $R_4$ and $R_5$ is a substituted or unsubstituted heteroaryl group of 2 to 30 carbon atoms for forming a ring.

In an embodiment, the emission layer may emit delayed fluorescence.

In an embodiment, the emission layer may be a delayed fluorescence emission layer including a host and a dopant, and the dopant may include the polycyclic compound.

In an embodiment, the emission layer may be a thermally activated delayed fluorescence emission layer which emits blue light.

In an embodiment, Formula 1 may be represented by the following Formula 2:

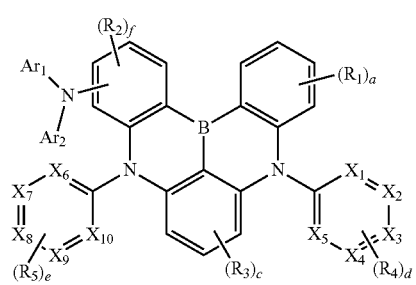

[Formula 2]

In Formula 2, $Ar_1$ and $Ar_2$ are each independently a substituted or unsubstituted aryl group of 6 to 30 carbon atoms for forming a ring, or a substituted or unsubstituted heteroaryl group of 2 to 30 carbon atoms for forming a ring, "f" is an integer of 0 to 3, and $X_1$ to $X_{10}$, $R_1$ to $R_5$, "a", and "c" to "e" are the same as defined in Formula 1.

In an embodiment, Formula 1 may be represented by the following Formula 3:

[Formula 3]

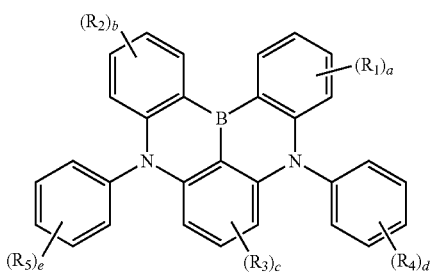

In Formula 3, $R_4$ and $R_5$ are each independently a hydrogen atom, a deuterium atom, a substituted or unsubstituted aryl group of 6 to 30 carbon atoms for forming a ring, or a substituted or unsubstituted heteroaryl group of 2 to 30 carbon atoms for forming a ring, at least one of $R_4$ and $R_5$ is a substituted or unsubstituted, N-containing heteroaryl group of 2 to 30 carbon atoms, and $R_1$ to $R_3$, and "a" to "e" are the same as defined in Formula 1.

In an embodiment, Formula 3 may be represented by the following Formula 4:

[Formula 4]

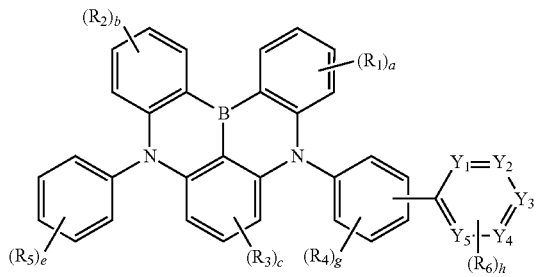

In Formula 4, $Y_1$ to $Y_5$ are each independently carbon or nitrogen, at least one among $Y_1$ to $Y_5$ is nitrogen, $R_6$ is a hydrogen atom, a deuterium atom, a substituted or unsubstituted aryl group of 6 to 30 carbon atoms for forming a ring, or a substituted or unsubstituted heteroaryl group of 2 to 30 carbon atoms for forming a ring, "g" is an integer of 0 to 4, "h" is an integer of 0 to 5, and $R_1$ to $R_5$, "a" to "c", and "e" are the same as defined in Formula 3.

In an embodiment, Formula 4 may be represented by the following Formula 5:

[Formula 5]

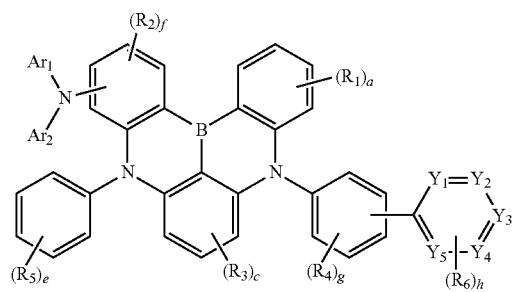

In Formula 5, $Ar_1$ and $Ar_2$ are each independently a substituted or unsubstituted aryl group of 6 to 30 carbon atoms for forming a ring, or a substituted or unsubstituted heteroaryl group of 2 to 30 carbon atoms for forming a ring, "f" is an integer of 0 to 3, and $R_1$ to $R_6$, $Y_1$ to $Y_5$, "a", "c", "e", "g", and "h" are the same as defined in Formula 4.

In an embodiment, Formula 1 may be represented by the following Formula 6:

[Formula 6]

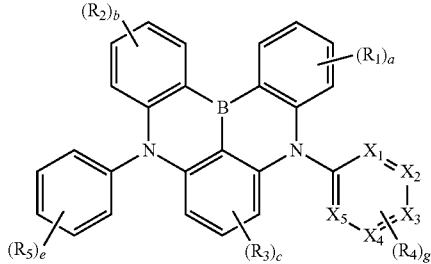

In Formula 6, $X_1$ to $X_5$ are each independently carbon or nitrogen, at least one among $X_1$ to $X_5$ is nitrogen, "g" is an integer of 0 to 4, and $R_1$ to $R_5$, "a" to "c", and "e" are the same as defined in Formula 1.

In an embodiment, Formula 6 may be represented by the following Formula 7:

[Formula 7]

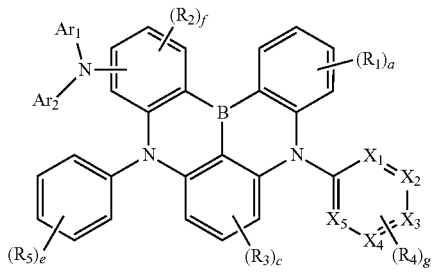

In Formula 7, $Ar_1$ and $Ar_2$ are each independently a substituted or unsubstituted aryl group of 6 to 30 carbon atoms for forming a ring, or a substituted or unsubstituted heteroaryl group of 2 to 30 carbon atoms for forming a ring, "f" is an integer of 0 to 3, and $X_1$ to $X_5$, $R_1$ to $R_5$, "a", "c", "e", and "g" are the same as defined in Formula 6.

In Formula 7, two of $X_1$ to $X_5$ may be nitrogen.

In an embodiment, the compound represented by Formula 1 may be any one among the compounds represented in Compound Group 1.

In an embodiment, the compound represented by Formula 1 may be any one among the compounds represented in Compound Group 2.

In an embodiment of the inventive concept, there is provided a polycyclic compound represented by Formula 1.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
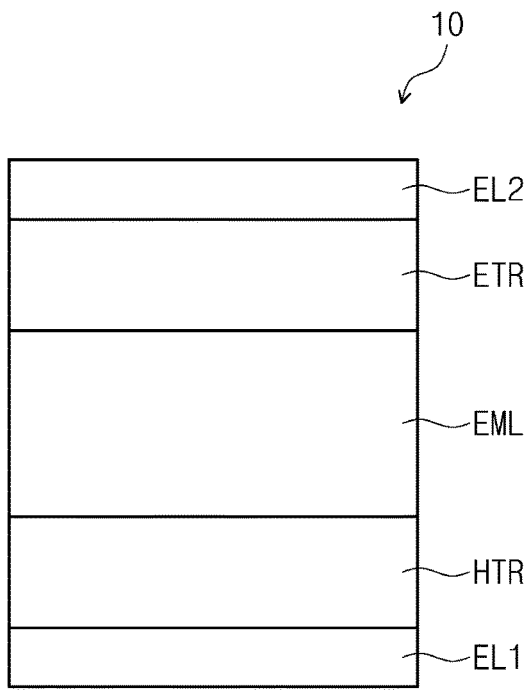
FIG. 1 is a cross-sectional view schematically illustrating an organic electroluminescence device according to an embodiment of the inventive concept.

The inventive concept may have various modifications and may be embodied in different forms, and example embodiments will be explained in detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being "on" another part, it can be "directly on" the other part, or intervening layers may also be present.

Hereinafter, the organic electroluminescence device according to an embodiment of the inventive concept will be explained with reference to FIGS. 1 to 3.

Figure 2:
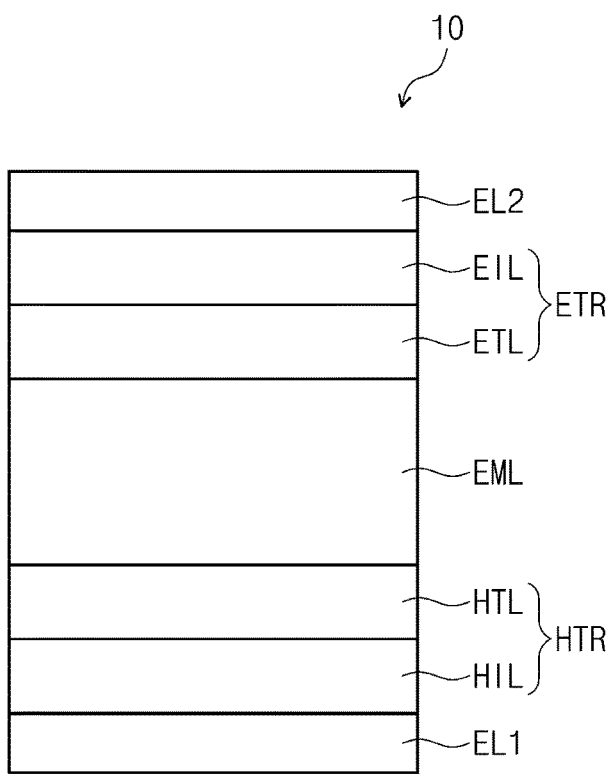
FIG. 2 is a cross-sectional view schematically illustrating an organic electroluminescence device according to an embodiment of the inventive concept.
Figure 3:
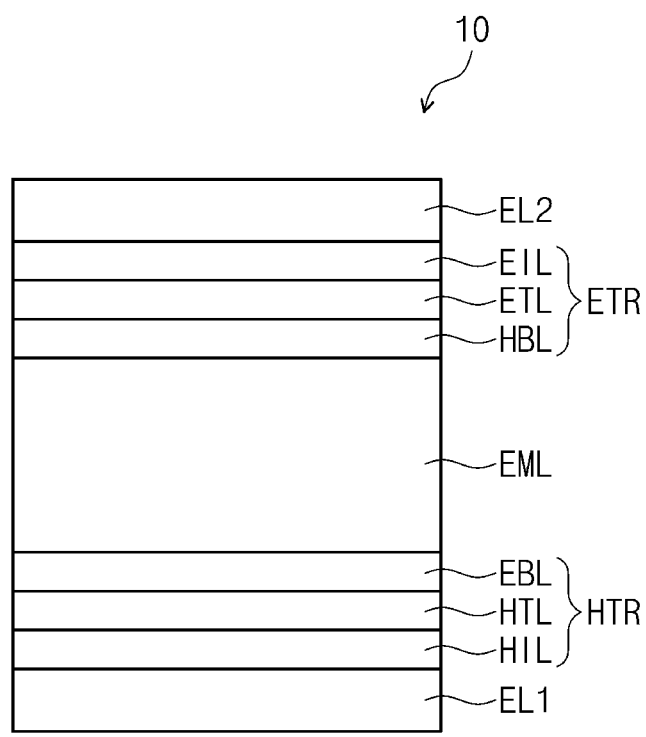
FIG. 3 is a cross-sectional view schematically illustrating an organic electroluminescence device according to an embodiment of the inventive concept.

Referring to FIGS. 1 to 3, an organic electroluminescence device 10 according to an embodiment may include a first electrode EL1, a hole transport region HTR, an emission layer EML, an electron transport region ETR and a second electrode EL2, laminated one by one.

The first electrode EL1 and the second electrode EL2 are oppositely disposed from each other, and a plurality of organic layers may be disposed between the first electrode EL1 and the second electrode EL2. The plurality of the organic layers may include a hole transport region HTR, an emission layer EML, and an electron transport region ETR. The organic electroluminescence device 10 of an embodiment may include the polycyclic compound of an embodiment in the emission layer EML.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

In the organic electroluminescence devices 10 of an embodiment, the first electrode EL1 has conductivity. The first electrode EL1 may be formed using a metal alloy or a conductive compound. The first electrode EL1 may be an anode.

The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a plurality of layers of ITO/Ag/ITO.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL of the organic electroluminescence device 10 of an embodiment may include a known hole injection material. For example, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methyl phenyl phenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris{N,N-diphenylamino}triphenylamine (TDATA), 4,4',4"-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or dipyrazino[2,3-f:2',3'-h]quinoxaline-2,3,6,7,10,11-hexacarbonitrile (HAT-CN). However, an embodiment of the inventive concept is not limited thereto.

The hole transport layer HTL of the organic electroluminescence device 10 of an embodiment may include a known hole transport material. For example, the hole transport layer HTL may include 1,1-bis[(di-4-trileamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphtyl)-N,N'-diphenylbenzidine (NPB), N,N'-bis(1-naphthyl)-N,N'-diphenyl-4,4'-diamine (α-NPD), etc. However, an embodiment of the inventive concept is not limited thereto.

Meanwhile, the hole transport region HTR may further include an electron blocking layer EBL, and the electron blocking layer EBL may be disposed between a hole transport layer HTL and an emission layer EML. The electron blocking layer EBL may play the role of preventing electron injection from an electron transport region ETR to a hole transport region HTR.

The electron blocking layer EBL may include a common material known in the art. The electron blocking layer EBL may include, for example, carbazole derivatives such as N-phenylcarbazole, and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenylbenzidine (NPD), 4,4'-cyclohexylidene bis[N,N-bis(4-methylphenyl) benzenamine](TAPC), 4,4'-bis[N,N'-(3-tolyl)amino]-3,3'-dimethylbiphenyl (HMTPD), mCP, etc. In addition, as described above, the electron blocking layer EBL may include the polycyclic compound according to an embodiment of the inventive concept.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-tetracyanoquinodimethane (F4-TCNQ), metal oxides such as tungsten oxide and molybdenum oxide, without limitation.

As described above, the hole transport region HTR may further include at least one of a hole buffer layer or an electron blocking layer EBL in addition to the hole injection layer HIL and the hole transport layer HTL. The hole buffer layer may compensate a resonance distance according to the wavelength of light emitted from the emission layer EML and increase light emission efficiency. Materials included in the hole transport region HTR may be used as materials included in the hole buffer layer.

The emission layer EML is provided on the hole transport region HTR. The emission layer EML may have a thickness of, for example, about 100 Å to about 600 Å. The emission layer EML may have a single layer formed using a single material, a single layer formed using a plurality of different materials, or a multilayer structure having a plurality of layers formed using a plurality of different materials.

The emission layer EML may emit one of red light, green light, blue light, white light, yellow light, and cyan light. The emission layer EML may include a fluorescence emitting material or a phosphorescence emitting material.

In an embodiment, the emission layer EML may be a fluorescence emission layer. For example, a portion of the light emitted from the emission layer EML may be attributed to thermally activated delayed fluorescence (TADF). Particularly, the emission layer EML may include a light-emitting component that emits thermally activated delayed fluorescence. In an embodiment, the emission layer EML may be an emission layer emitting thermally activated delayed fluorescence that emits blue light.

In the description, -* means a connecting position.

In the description, the term "substituted or unsubstituted" corresponds to substituted or unsubstituted with at least one substituent selected from the group consisting of a deuterium atom, a halogen atom, a cyano group, a nitro group, an amine group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the description, the halogen atom may be a fluorine atom, a chlorine atom, a bromine atom or an iodine atom.

In the description, the alkyl may be a linear, branched or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the fluorenyl group may be substituted, and two substituents may be combined with each other to form a spiro structure. Examples of a substituted fluorenyl group are as follows. However, an embodiment of the inventive concept is not limited thereto.

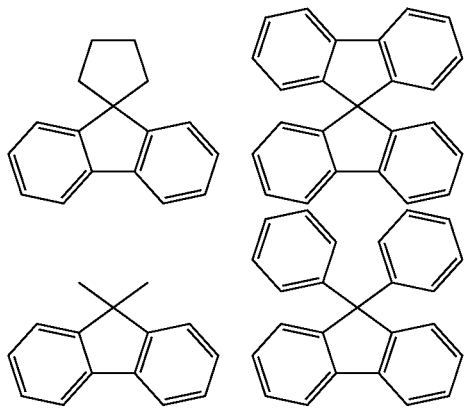

In the description, the heteroaryl may be a heteroaryl including at least one of O, N, P, Si or S as a heteroatom. The carbon number for forming a ring of the heteroaryl may be 2 to 30, or 2 to 20. The heteroaryl may be monocyclic heteroaryl or polycyclic heteroaryl. Examples of the polycyclic heteroaryl may have a dicyclic or tricyclic structure. Examples of the heteroaryl may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuranyl, phenanthroline, thiazolyl, isooxazolyl, oxadiazolyl, thiadiazolyl, benzothiazolyl, phenothiazinyl, dibenzosilole, dibenzofuran, etc., without limitation.

In the description, the carbon number of the amine group is not specifically limited, but may be 1 to 30. The amine group may include an alkyl amine group and an aryl amine group. Examples of the amine group include a methylamine group, a dimethylamine group, a phenylamine group, a naphthylamine group, a 9-methyl-anthracenylamine group, a triphenylamine group, etc., without limitation.

In an embodiment, the emission layer EML includes a polycyclic compound represented by Formula 1.

[Formula 1]

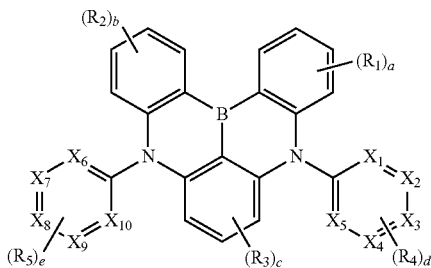

In Formula 1, $X_1$ to $X_{10}$ may be each independently carbon or nitrogen.

In Formula 1, $R_1$ to $R_5$ may be each independently a hydrogen atom, a deuterium atom, a substituted or unsubstituted amine group, a substituted or unsubstituted aryl group of 6 to 30 carbon atoms for forming a ring, or a substituted or unsubstituted heteroaryl group of 2 to 30 carbon atoms for forming a ring.

Meanwhile, $R_1$ to $R_5$ do not include an alkyl group, particularly, a cyclic alkyl group. If $R_1$ to $R_5$ included an alkyl group, though possessing a heteroaryl group as a substituent, the orbital separation between the highest occupied molecular orbital (HOMO) and the lowest unoccupied molecular orbital (LUMO) is insufficient due to multiple resonance effect, and if applied in a device, the half-width of the emission layer decreases to about 30 nm or less, and the rate of reverse intersystem crossing (RISC) for converting a triplet energy level (T1) to a singlet energy level (S1) is insufficient.

In Formula 1, "a" and "b" are each independently an integer of 0 to 4. Meanwhile, if "a" is 2 or more, a plurality of $R_1$ groups are the same or different, and if "b" is 2 or more, a plurality of $R_2$ groups are the same or different.

In Formula 1, "c" is an integer of 0 to 3. Meanwhile, if "c" is 2 or more, a plurality of $R_3$ groups are the same or different.

In Formula 1, "d" and "e" are each independently an integer of 0 to 5. Meanwhile, if "d" is 2 or more, a plurality of $R_4$ groups are the same or different, and if "e" is 2 or more, a plurality of $R_5$ groups are the same or different.

In Formula 1, if all $X_1$ to $X_{10}$ are carbon, at least one of $R_4$ and $R_5$ is a substituted or unsubstituted heteroaryl group of 2 to 30 carbon atoms for forming a ring. In this case, "d" and "e" are not 0 at the same time.

In the polycyclic compound according to the inventive concept, a

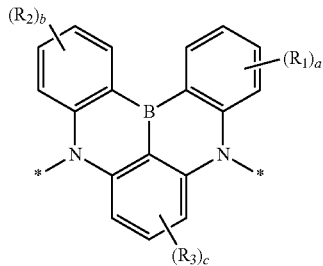

part, which is a ring structure formed by N—B—N may be an electron donor, and

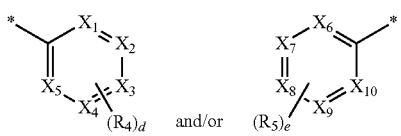

parts, which are bonded to the nitrogen of the electron donor, may be electron acceptors. However, an embodiment of the inventive concept is not limited thereto. The polycyclic compound includes an electron acceptor which is bonded to the nitrogen of an electron donor and delocalizes electron density in a molecule, thereby decreasing the absolute value ($\Delta E_{st}$) of a difference between a singlet energy level (S1) and a triplet energy level (T1) and increasing the rate constant of reverse intersystem crossing (RISC) converting the triplet energy level (T1) into the singlet energy level (S1). Accordingly, the life of an organic electroluminescence device may be increased.

In an embodiment, Formula 1 may include an arylamine group as a substituent. In this case, Formula 1 may be represented by Formula 2.

[Formula 2]

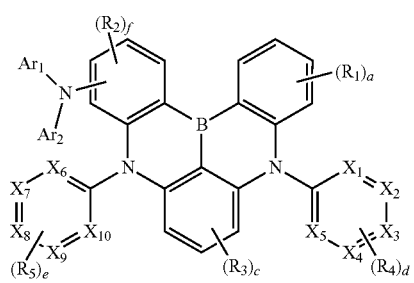

In Formula 2, $Ar_1$ and $Ar_2$ may be each independently a substituted or unsubstituted aryl group of 6 to 30 carbon atoms for forming a ring, or a substituted or unsubstituted heteroaryl group of 2 to 30 carbon atoms for forming a ring.

In Formula 2, "f" may be an integer of 0 to 3. Meanwhile, if "f" is 2 or more, a plurality of $R_2$ groups are the same or different.

In Formula 2, $X_1$ to $X_{10}$, $R_1$ to $R_5$, "a", and "c" to "e" are the same as defined in Formula 1.

In an embodiment, all $X_1$ to $X_{10}$ in Formula 1 may be carbon. In this case, Formula 1 may be represented by Formula 3.

[Formula 3]

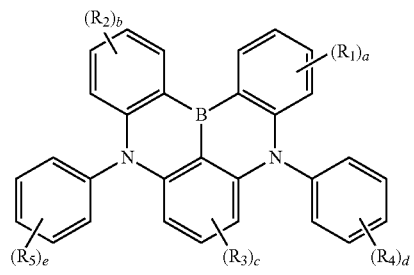

In Formula 3, $R_4$ and $R_5$ may be each independently a hydrogen atom, a deuterium atom, a substituted or unsubstituted aryl group of 6 to 30 carbon atoms for forming a ring, or a substituted or unsubstituted heteroaryl group of 2 to 30 carbon atoms for forming a ring. At least one among $R_4$ and $R_5$ may be a substituted or unsubstituted, N-containing heteroaryl group of 2 to 30 carbon atoms. In this case, "d" and "e" are not 0 at the same time.

In Formula 3, $R_1$ to $R_3$, and "a" to "e" are the same as defined in Formula 1.

In an embodiment, in the polycyclic compound, a heteroaryl group containing N, as an electron acceptor may be bonded to the N of an electron donor.

In an embodiment, if $R_4$ of Formula 3 is a heteroaryl group including N, Formula 3 may be represented by Formula 4.

[Formula 4]

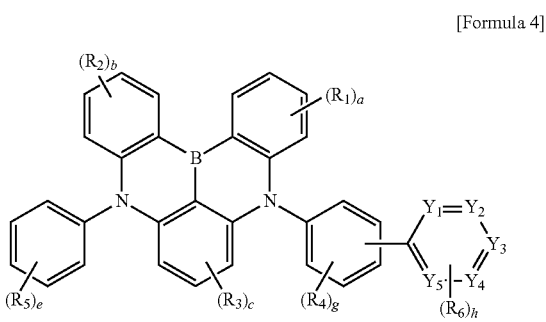

In Formula 4, $Y_1$ to $Y_5$ may be each independently carbon or nitrogen, and at least one among $Y_1$ to $Y_5$ may be nitrogen.

In Formula 4, $R_6$ may be a hydrogen atom, a deuterium atom, a substituted or unsubstituted aryl group of 6 to 30 carbon atoms for forming a ring, or a substituted or unsubstituted heteroaryl group of 2 to 30 carbon atoms for forming a ring.

In Formula 4, "g" may be an integer of 0 to 4. Meanwhile, if "g" is 2 or more, a plurality of $R_4$ groups are the same or different. Meanwhile, "g" of Formula 4 is an integer that is one less than "d" of Formula 3. For example, if "d" is 1, "g" is 0.

In Formula 4, "h" is an integer of 0 to 5. Meanwhile, if "h" is 2 or more, a plurality of $R_6$ groups are the same or different.

In Formula 4, $R_1$ to $R_5$, "a" to "c", and "e" are the same as defined in Formula 3.

In an embodiment, Formula 4 may include an arylamine group as a substituent. In this case, Formula 4 may be represented by Formula 5.

[Formula 5]

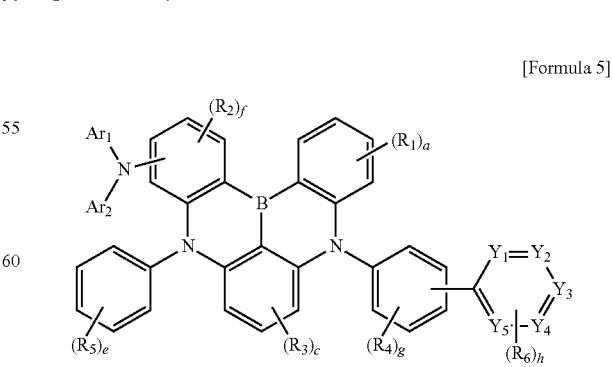

In Formula 5, $Ar_1$ and $Ar_2$ may be each independently a substituted or unsubstituted aryl group of 6 to 30 carbon atoms for forming a ring, or a substituted or unsubstituted heteroaryl group of 2 to 30 carbon atoms for forming a ring.

In Formula 5, "f" is an integer of 0 to 3. Meanwhile, if "f" is 2 or more, a plurality of $R_2$ groups are the same or different. Meanwhile, "f" of Formula 5 is an integer that is one less than "b" of Formula 4. For example, if "b" is 1, "f" is 0.

In Formula 5, $R_1$ to $R_6$, $Y_1$ to $Y_5$, "a", "c", "e", "g", and "h" are the same as defined in Formula 4.

In an embodiment, the polycyclic compound may include a pyridine group as an electron acceptor, and in this case, one among $Y_1$ to $Y_5$ of Formula 4 or Formula 5 may be nitrogen.

In an embodiment, all $X_6$ to $X_{10}$ of Formula 1 may be carbon. In this case, Formula 1 may be represented by Formula 6.

[Formula 6]

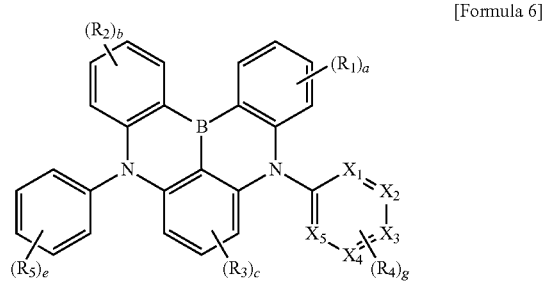

In Formula 6, $X_1$ to $X_5$ may be each independently carbon or nitrogen, and at least one among $X_1$ to $X_5$ may be nitrogen.

In Formula 6, "g" is an integer of 0 to 4. Meanwhile, if "g" is 2 or more, a plurality of $R_4$ groups are the same or different. Meanwhile, "g" of Formula 6 is an integer that is one less than "d" of Formula 1. For example, if "d" is 1, "g" is 0.

In Formula 6, $R_1$ to $R_5$, "a" to "c", and "e" are the same as defined in Formula 1.

In an embodiment, Formula 6 may include an arylamine group as a substituent. In this case, Formula 6 may be represented by Formula 7.

[Formula 7]

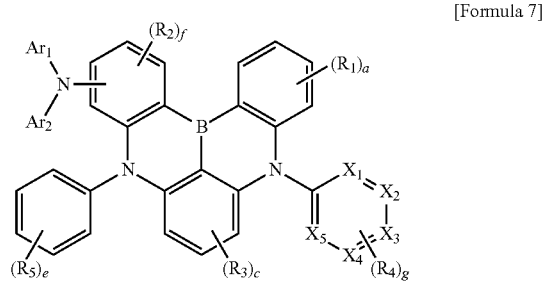

In Formula 7, $Ar_1$ and $Ar_2$ may be each independently a substituted or unsubstituted aryl group of 6 to 30 carbon atoms for forming a ring, or a substituted or unsubstituted heteroaryl group of 2 to 30 carbon atoms for forming a ring.

In Formula 7, "f" is an integer of 0 to 3. Meanwhile, if "f" is 2 or more, a plurality of $R_2$ groups are the same or different. Meanwhile, "f" of Formula 7 is an integer that is one less than "b" of Formula 6. For example, if "b" is 1, "f" is 0.

In Formula 7, $X_1$ to $X_5$, $R_1$ to $R_5$, "a", "c", "e", and "g" are the same as defined in Formula 6.

In an embodiment, in the polycyclic compound, a pyrimidine group as an electron acceptor may be bonded to the N of an electron donor. In this case, two among $X_1$ to $X_5$ in Formula 7 may be nitrogen.

The polycyclic compound of an embodiment, represented by Formula 1 may be a material for emitting delayed fluorescence. The polycyclic compound of an embodiment may be a material for thermally activated delayed fluorescence.

For example, the polycyclic compound represented by Formula 1 has a small difference between a singlet energy level (S1) and a triplet energy level (T1), and may be used as a material for emitting thermally activated delayed fluorescence. Particularly, the polycyclic compound represented by Formula 1 may be used as a blue emitting material which emits thermally activated delayed fluorescence. However, an embodiment of the inventive concept is not limited thereto. The polycyclic compound of an embodiment may be used as a material for thermally activated delayed fluorescence, which emits green light or red light.

The polycyclic compound of an embodiment, represented by Formula 1 may be any one among the compounds represented in the following Compound Group 1.

[Compound Group 1]

A-1

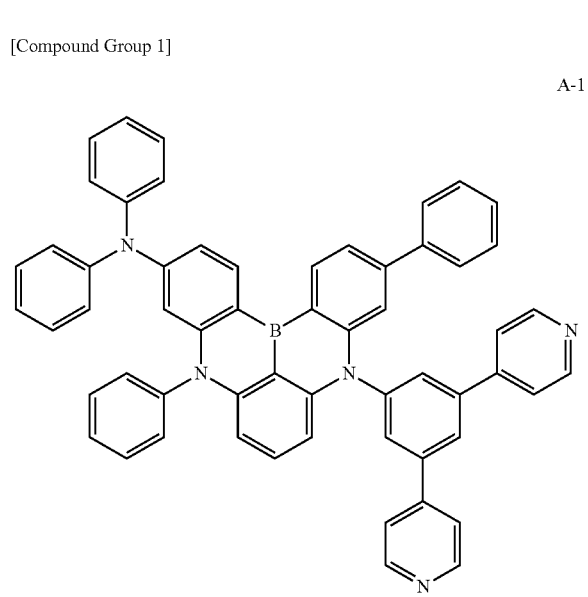

A-2

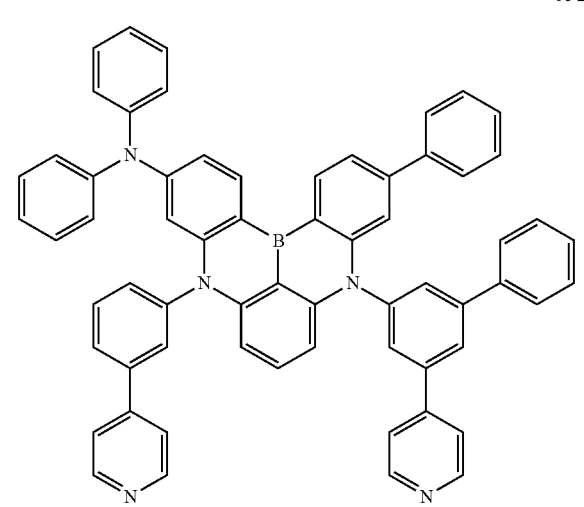

A-3
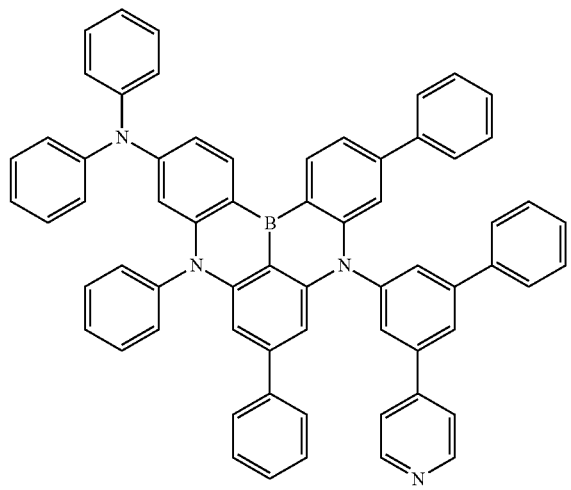
A-4
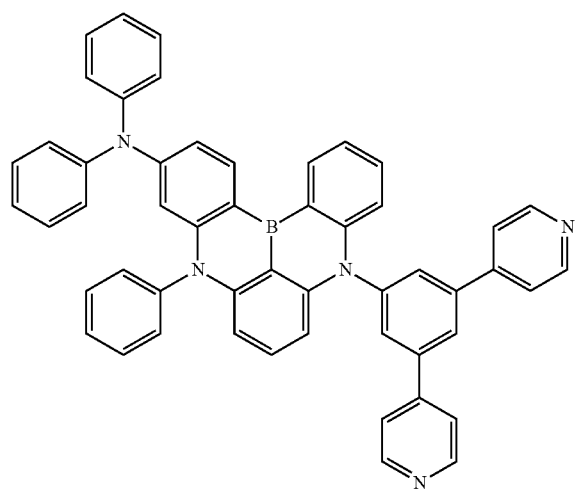
A-5
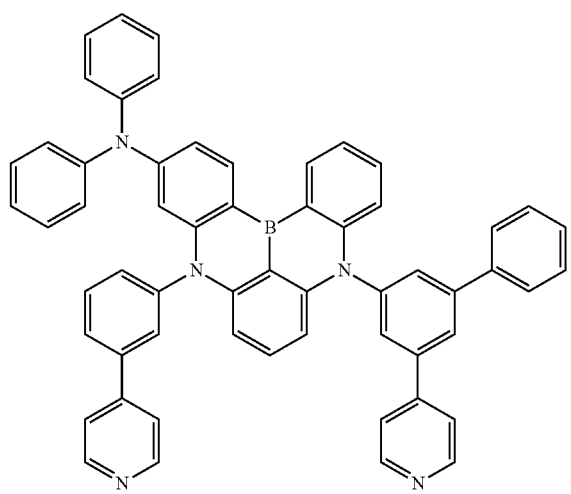
A-6
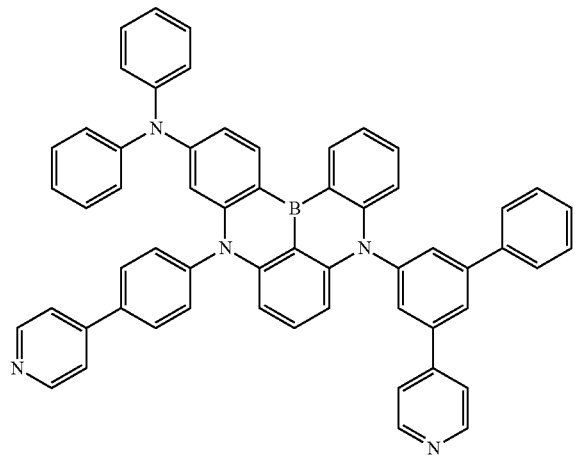
A-7
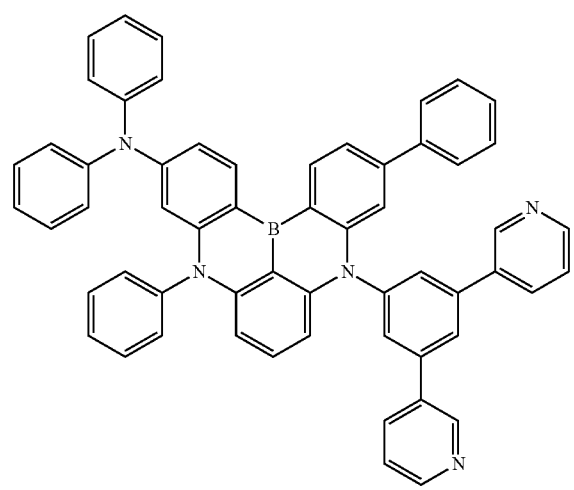
A-8
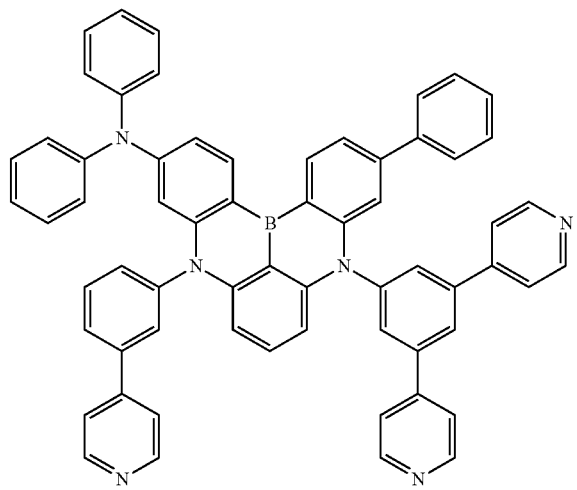

A-9
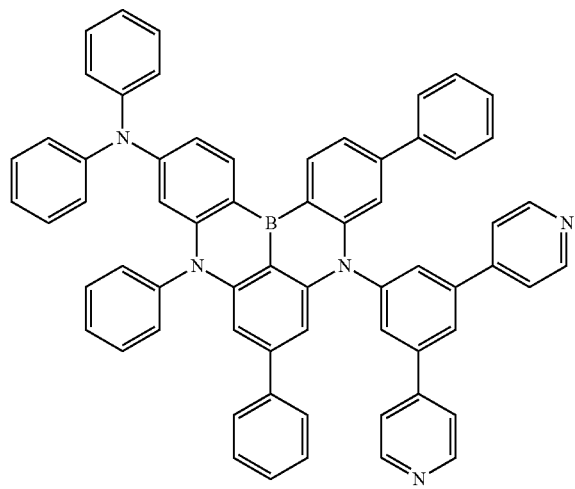
A-10
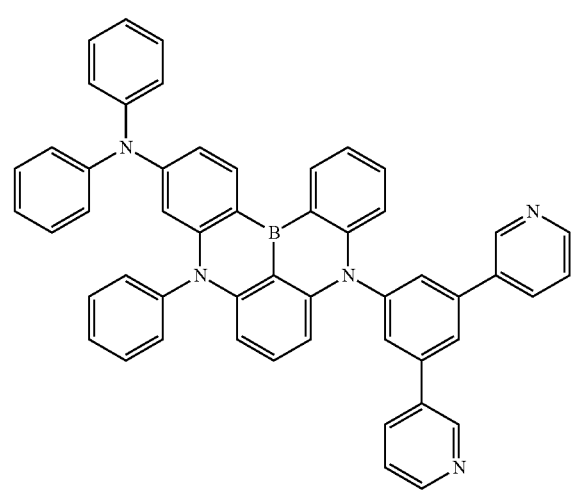
A-11
A-12
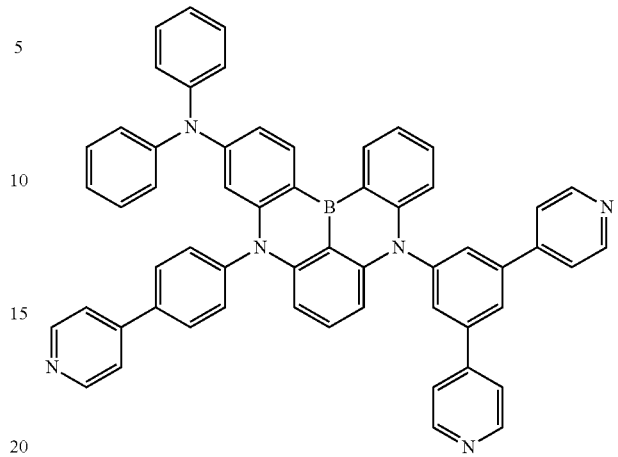
A-13
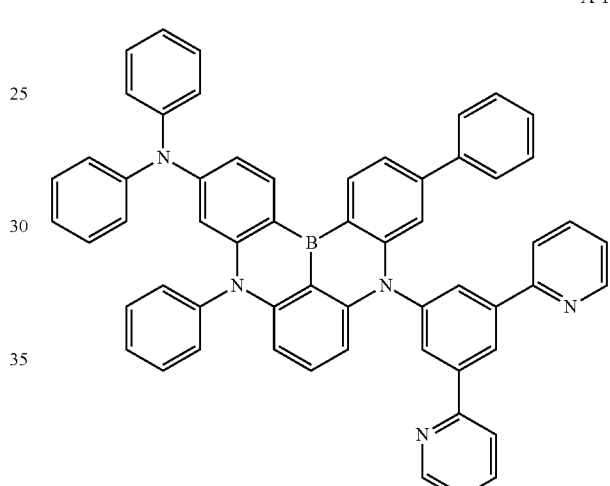
A-14
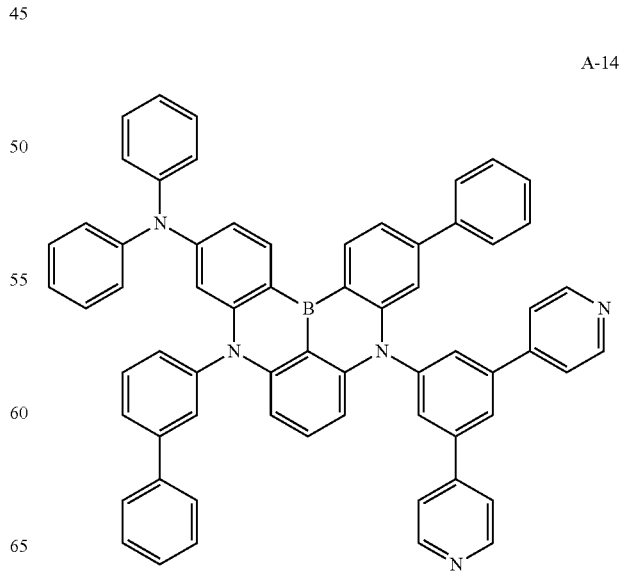

-continued
A-15
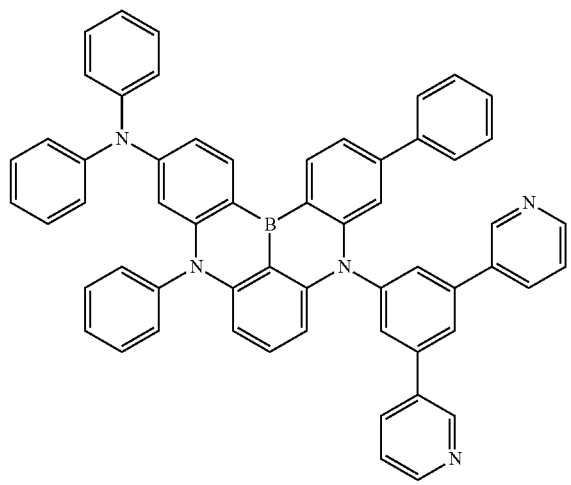
A-16
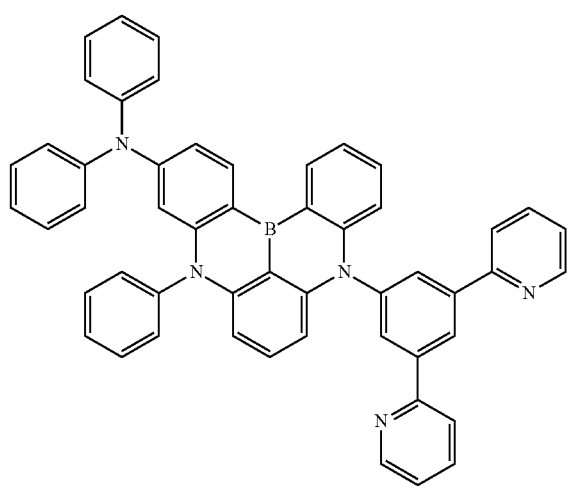
A-17
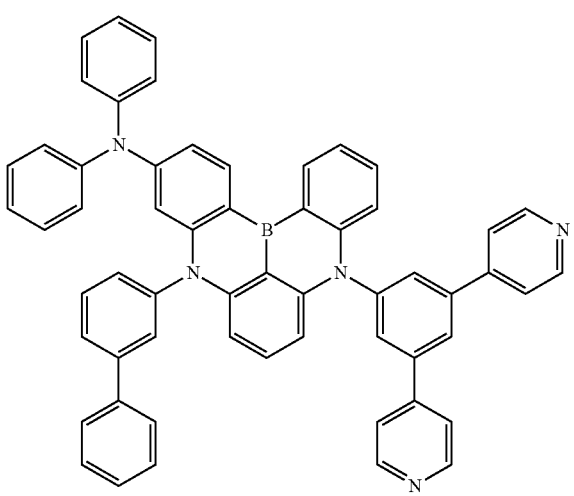
A-18
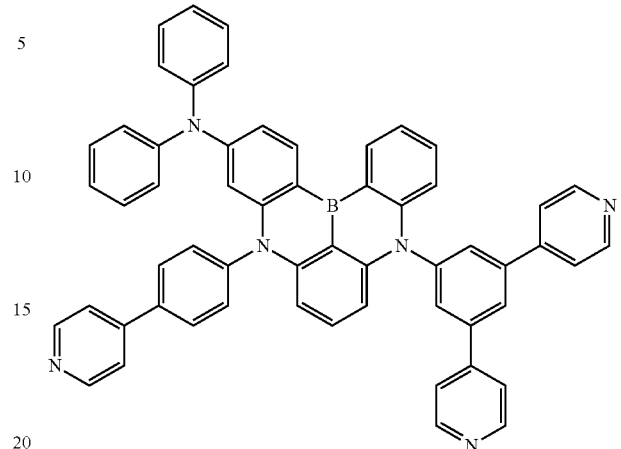
A-19
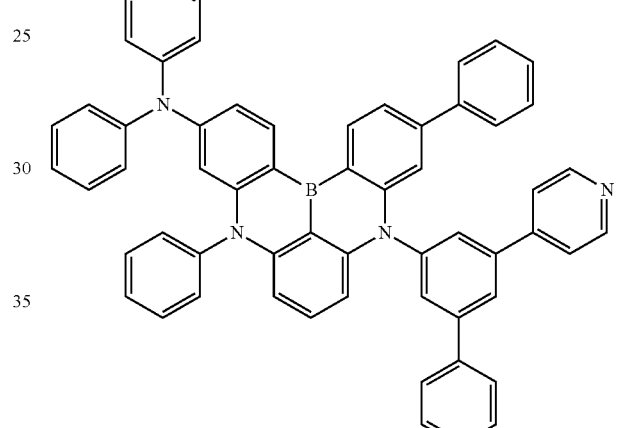
A-20
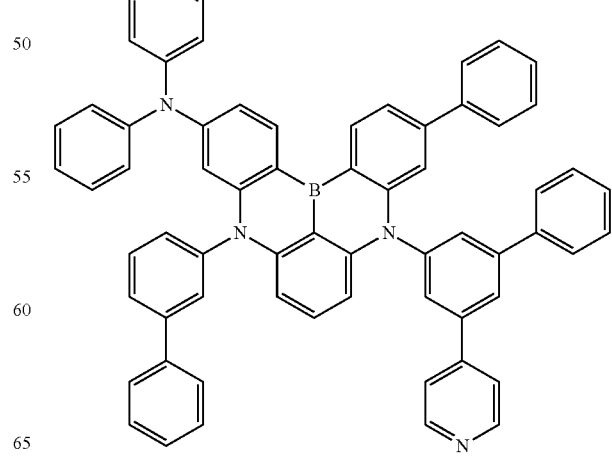

A-21
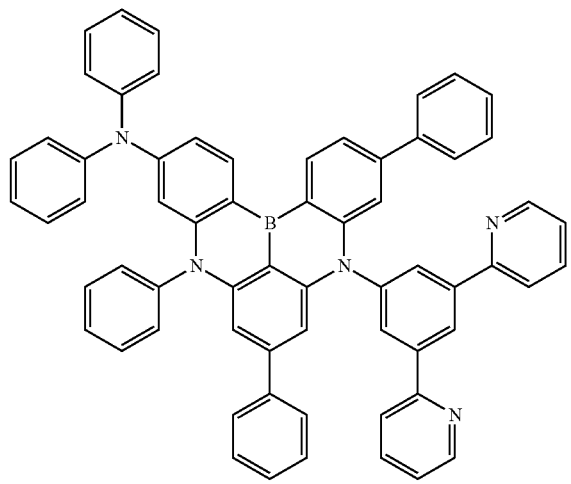
A-22
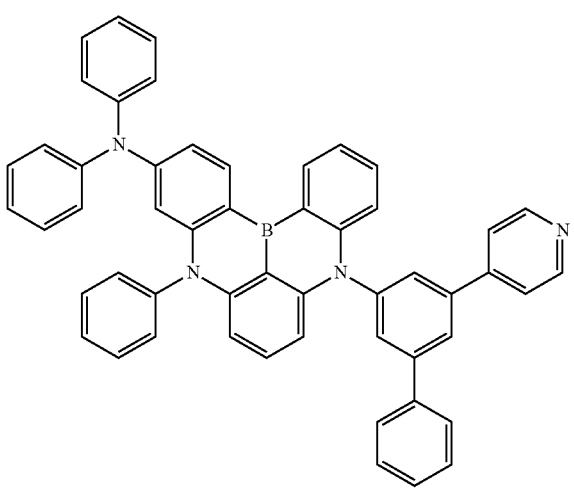
A-23
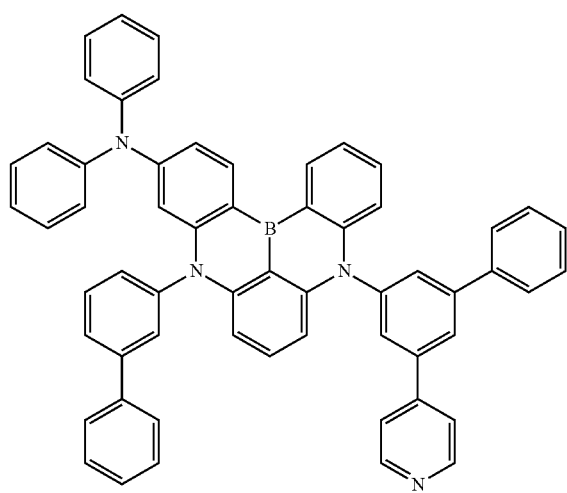
A-24
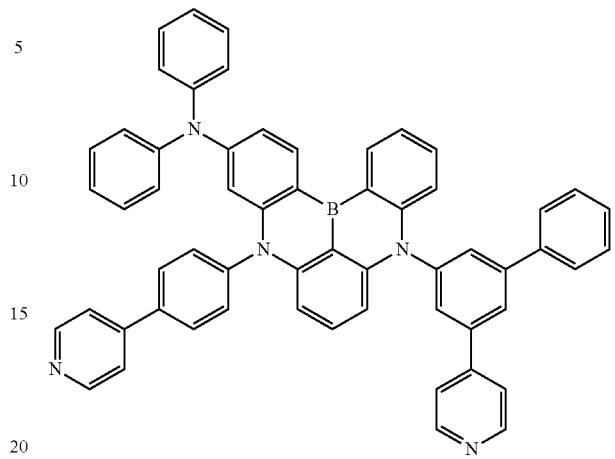
The polycyclic compound of an embodiment, represented by Formula 1 may be any one among the compounds represented in the following Compound Group 2.
[Compound Group 2]
B-1
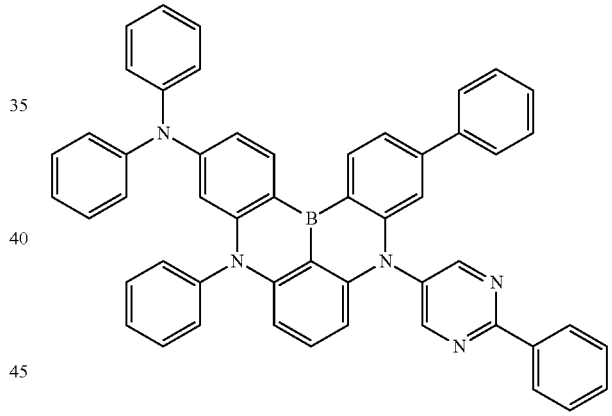
B-2
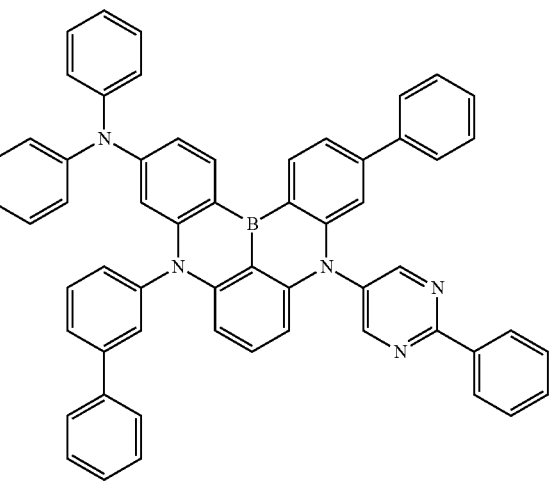

B-3
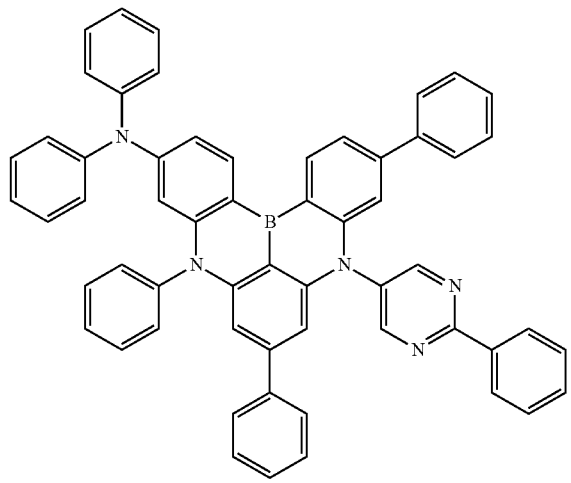
B-4
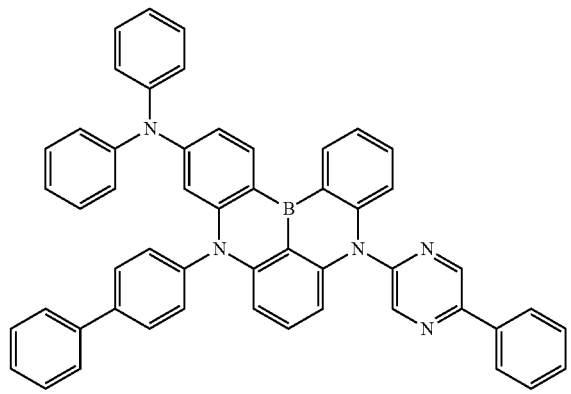
B-5
B-6
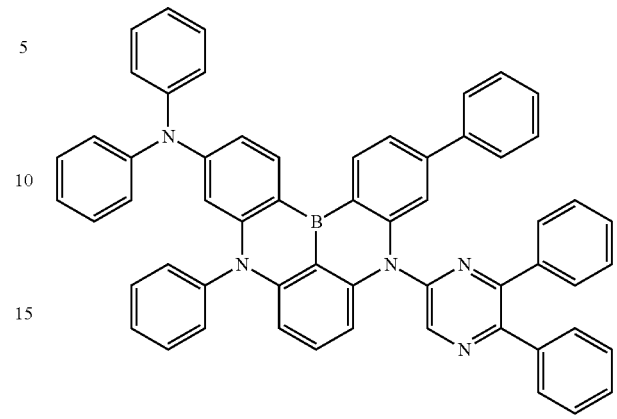
B-7
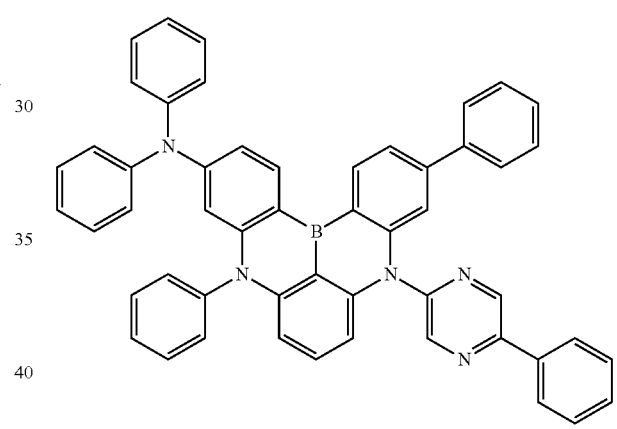
B-8
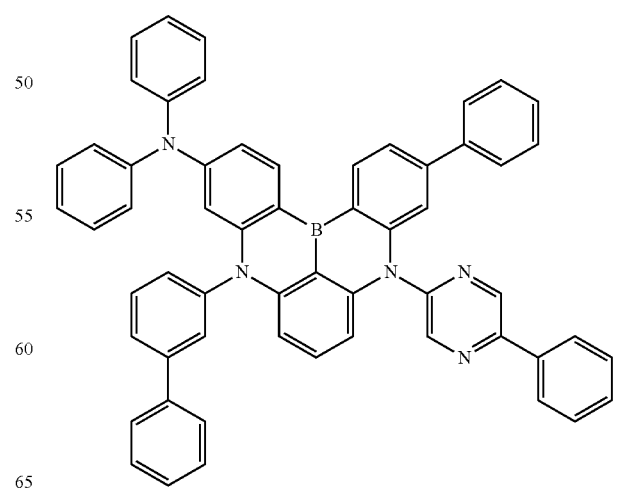

B-9
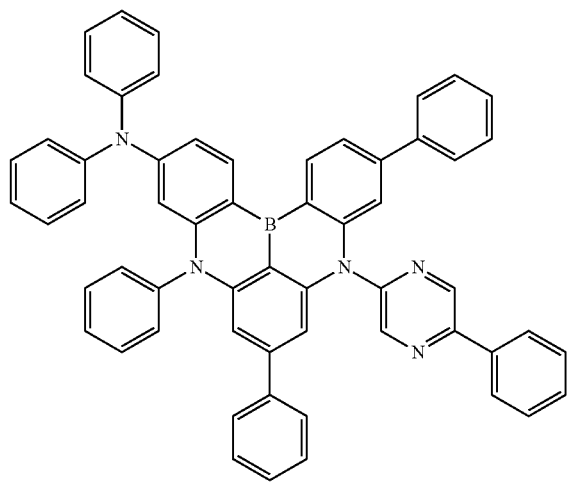
B-12
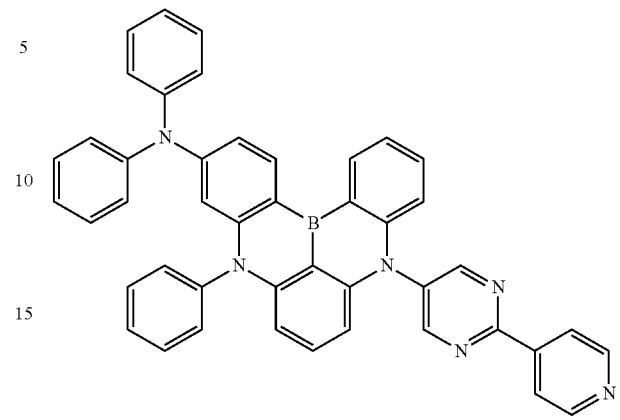
B-10
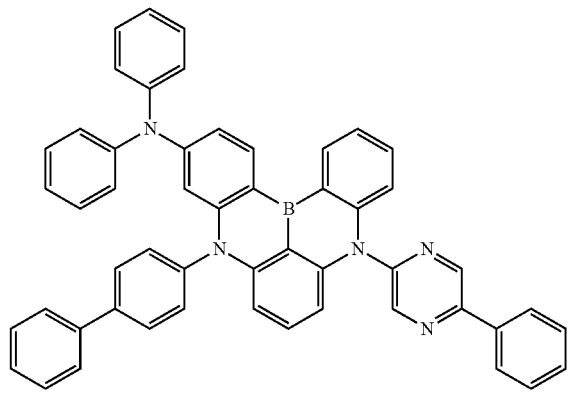
B-13
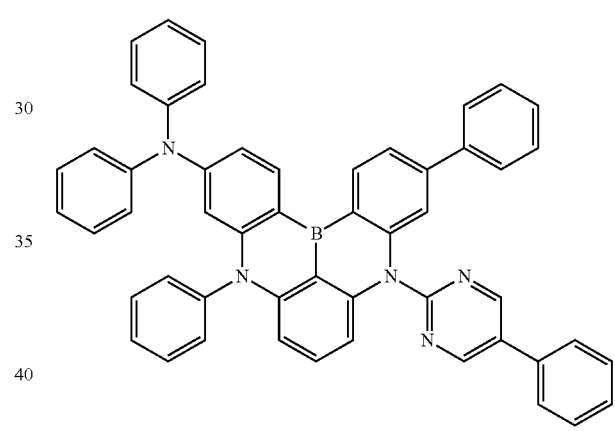
B-11
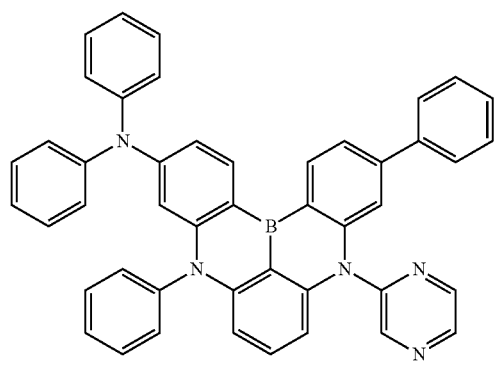
B-14
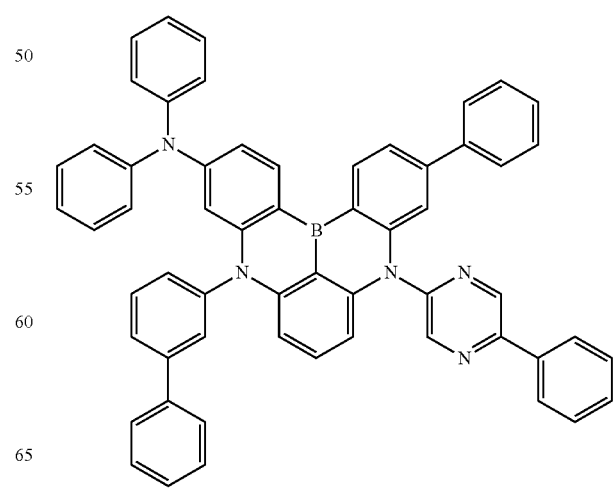

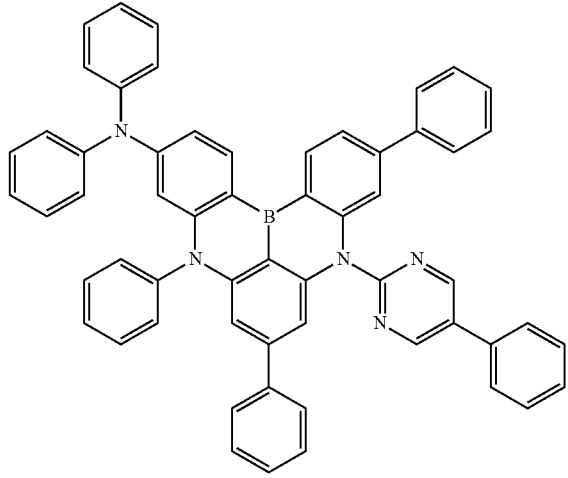

B-15

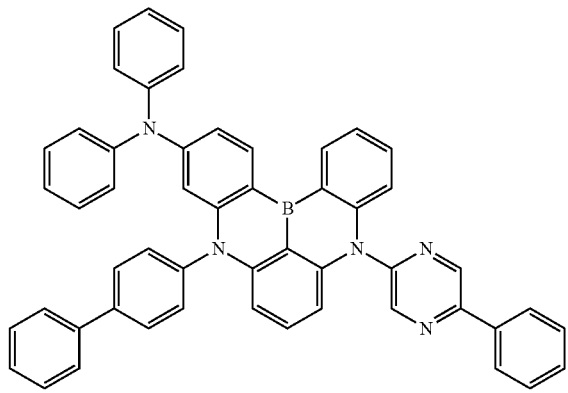

B-16

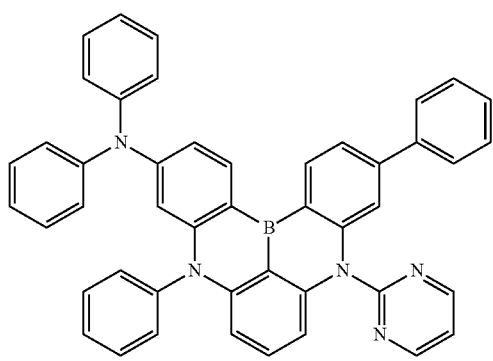

B-17

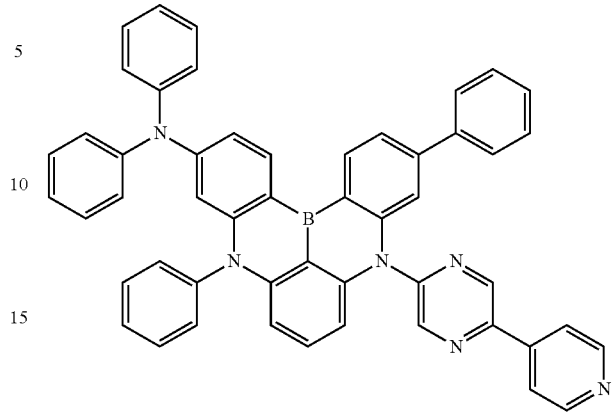

B-18

The polycyclic compound represented by Formula 1 is used in the organic electroluminescence device 10 of an embodiment and may improve the efficiency and life of the organic electroluminescence device. Particularly, the polycyclic compound represented by Formula 1 is used in the emission layer EML of the organic electroluminescence device 10 of an embodiment and may improve the emission efficiency and life of the organic electroluminescence device.

In an embodiment, the emission layer EML includes a host and a dopant, and the host may be a host for emitting delayed fluorescence and the dopant may be a dopant for emitting delayed fluorescence. Meanwhile, the polycyclic compound of an embodiment, represented by Formula 1, may be included as a dopant material of an emission layer EML. For example, the polycyclic compound of an embodiment, represented by Formula 1 may be used as a TADF dopant.

Meanwhile, in an embodiment, the emission layer EML may include a known host material. For example, in an embodiment, the emission layer EML may include, as a host material, one or more of tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. However, an embodiment of the inventive concept is not limited thereto. Any known host materials for emitting delayed fluorescence other than the suggested host materials may be included.

Meanwhile, in the organic electroluminescence device 10 of an embodiment, the emission layer EML may further include a known dopant material. In an embodiment, the emission layer EML may include, as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino) styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

Referring to FIGS. 1 to 3 again, in the organic electroluminescence device 10 of an embodiment, the electron transport region ETR is provided on the emission layer EML. The electron transport region ETR may include at least one of an electron blocking layer, an electron transport layer ETL or an electron injection layer EIL. However, an embodiment of the inventive concept is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation. The thickness of the electron transport region ETR may be, for example, from about 100 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include, for example, one or more of tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof, without limitation.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include, for example, LiF, lithium quinolate (LiQ), $Li_2O$, BaO, NaCl, CsF, a metal in lanthanoides such as Yb, or a metal halide such as RbCl, RbI and KI. However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates.

If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer as described above. The hole blocking layer may include, for example, at least one of 2,9-dimethyl-4,7-diphenyl-1,10-phenanthroline (BCP), and 4,7-diphenyl-1,10-phenanthroline (Bphen). However, an embodiment of the inventive concept is not limited thereto.

The second electrode EL2 is provided on the electron transport region ETR. The second electrode EL2 has conductivity. The second electrode EL2 may be formed using a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission type, the first electrode EL1 may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

The organic electroluminescence device of an embodiment of the inventive concept uses the polycyclic compound as a material for an emission layer and may have improved emission efficiency and life characteristics.

An embodiment of the inventive concept provides a polycyclic compound represented by the following Formula 1:

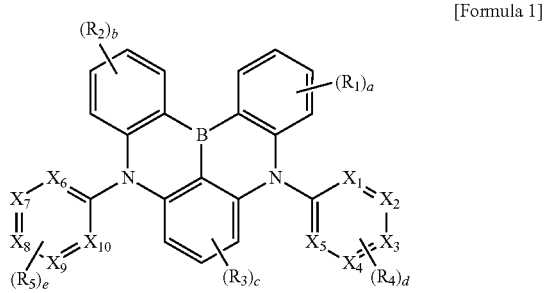

[Formula 1]

In Formula 1, each of $X_1$ to $X_{10}$ may independently be carbon or nitrogen.

In Formula 1, each of $R_1$ to $R_5$ may independently be a hydrogen atom, a deuterium atom, a substituted or unsubstituted amine group, a substituted or unsubstituted aryl group of 6 to 30 carbon atoms for forming a ring, or a substituted or unsubstituted heteroaryl group of 2 to 30 carbon atoms for forming a ring.

None of $R_1$ to $R_5$ includes an alkyl group, particularly, a cyclic alkyl group. If $R_1$ to $R_5$ included an alkyl group, molecular stability may be degraded, and if applied in a device, the half-width of the emission layer decreases to about 30 nm or less, and the rate of reverse intersystem crossing (RISC) for converting a triplet energy level (T1) to a singlet energy level (S1) may be deteriorated.

In Formula 1, each of "a" and "b" is independently an integer of 0 to 4. Meanwhile, if "a" is 2 or more, a plurality of $R_1$ groups are the same or different, and if "b" is 2 or more, a plurality of $R_2$ groups are the same or different.

In Formula 1, "c" is an integer of 0 to 3. Meanwhile, if "c" is 2 or more, a plurality of $R_3$ groups are the same or different.

In Formula 1, each of "d" and "e" is independently an integer of 0 to 5. If "d" is 2 or more, a plurality of $R_4$ groups are the same or different, and if "e" is 2 or more, a plurality of $R_5$ groups are the same or different.

In Formula 1, if all $X_1$ to $X_{10}$ are carbon, at least one among $R_4$ and $R_5$ is a substituted or unsubstituted heteroaryl group of 2 to 30 carbon atoms for forming a ring. In this case, "d" and "e" are not 0 at the same time.

The same explanation on the polycyclic compound in the organic electroluminescence device of an embodiment may be applied to the polycyclic compound of an embodiment, represented by Formula 1.

The polycyclic compound according to an embodiment may be any one selected from the compounds represented in Compound Group 1 above.

The polycyclic compound according to an embodiment may be any one selected from the compounds represented in Compound Group 2 above.

Hereinafter, the inventive concept will be more particularly explained referring to particular embodiments and comparative embodiments. The following embodiments are only illustrations to assist the understanding of the inventive concept, and the scope of the inventive concept is not limited thereto.

EXAMPLES

1. Synthesis of Polycyclic Compounds

First, the synthetic method of the polycyclic compounds according to exemplary embodiments of the inventive concept will be particularly explained referring to the synthetic methods of Compound A-1, Compound A-2, and Compound A-3. In addition, the synthetic methods of the polycyclic compounds explained below are only embodiments, and the synthetic method of the polycyclic compound according to an embodiment of the inventive concept is not limited thereto.

(Synthetic Example of Compound A-1)

The polycyclic compound according to an embodiment, Compound A-1, may be synthesized according to the following Reaction:

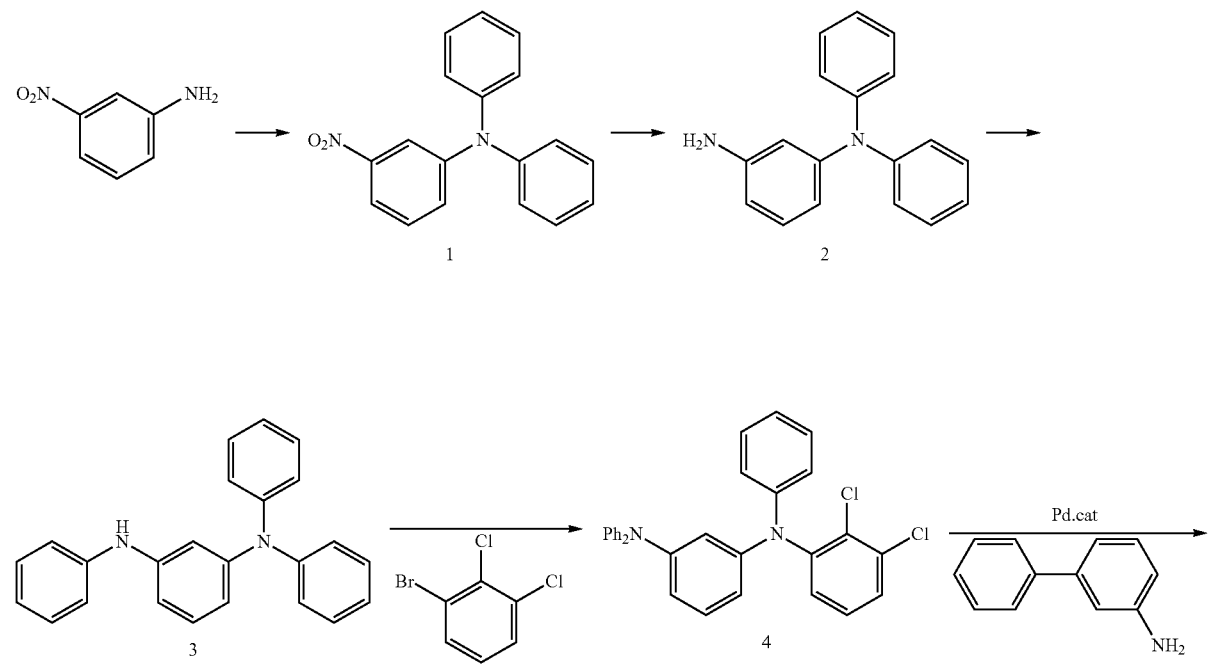

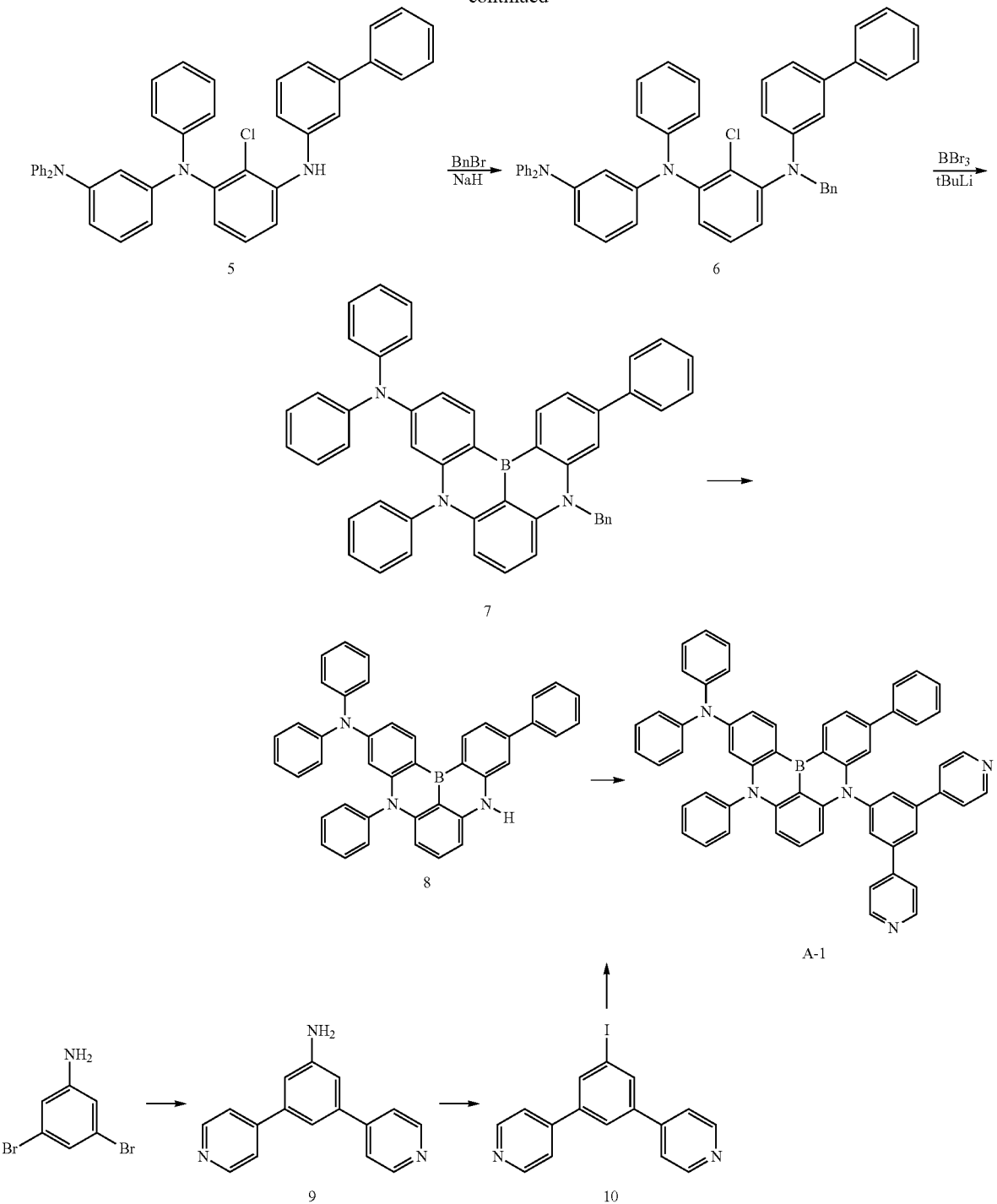

An o-dichlorobenzene solution (300 ml) including 3-nitroaniline (25 g), iodobenzene (81.2 g), potassium carbonate (150 g) and copper iodide (6.9 g) was heated and refluxed for about 8 hours. After cooling to room temperature, the reaction solution was poured into water. The target material was extracted with toluene, dried with magnesium sulfate and concentrated under a reduced pressure. The mixture thus obtained was separated by silica gel column chromatography to obtain 51.0 g (yield 97%) of Intermediate 1.

A mixture solution of ethanol (120 ml) and water (60 ml), including intermediate 1 (51 g) thus obtained, iron (30 g) and ammonium chloride (29 g) was heated and refluxed under heating conditions in an oil bath for about 4 hours. The reaction solution was cooled to room temperature and filtered, and ethanol was distilled off. The target product was extracted with ethyl acetate, dried with magnesium sulfate and concentrated under a reduced pressure. The mixture thus obtained was separated by silica gel column chromatography to obtain 42.5 g (yield 93%) of Intermediate 2.

A toluene solution (570 ml) including Intermediate 2 (42.5 g) thus obtained, bromobenzene (25.2 g), sodium butoxide (31 g), Pd$_2$(dba)$_3$ (2.1 g) and PH(tBu)$_3$/BF$_4$ (2.6 g) was heated and refluxed under heating conditions in an oil bath for about 3 hours. After cooling to room temperature, the reaction solution was poured into water. The target material was extracted with toluene, dried with magnesium sulfate and concentrated under a reduced pressure. The mixture thus obtained was separated by silica gel column chromatography to obtain 52 g (yield 95%) of Intermediate 3.

A toluene solution (350 ml) including Intermediate 3 (52 g) thus obtained, 1-bromo-2,3-dichlorobenzene (34.9 g), sodium butoxide (34 g), Pd$_2$(dba)$_3$ (3.2 g) and PH(tBu)$_3$/BF$_4$ (4.1 g) was heated and refluxed under heating conditions in an oil bath for about 3 hours. After cooling to room temperature, the reaction solution was poured into water. The target material was extracted with toluene, dried with magnesium sulfate and concentrated under a reduced pressure. The mixture thus obtained was separated by silica gel column chromatography to obtain 67 g (yield 90%) of Intermediate 4.

A toluene solution (50 ml) including intermediate 4 (6.7 g) thus obtained, 3-aminobiphenyl (2.3 g), sodium butoxide (2.4 g), Pd$_2$(dba)$_3$ (0.22 g) and PH(tBu)$_3$/BF$_4$ (0.29 g) was heated and refluxed under heating conditions in an oil bath for about 4 hours. After cooling to room temperature, the reaction solution was poured into water. The target material was extracted with ethyl acetate, dried with magnesium sulfate and concentrated under a reduced pressure. The mixture thus obtained was separated by silica gel column chromatography to obtain 7.7 g (yield 90%) of Intermediate 5.

A DMF solution (75 ml) including Intermediate 5 (7.7 g) thus obtained and NaH (0.7 g) was cooled in ice. Benzyl bromide (2.1 ml) was added thereto, followed by stirring for about 2 hours in ice. After securing the disappearance of the raw material by TLC, the reaction solution was poured into water. The target material was extracted with toluene, dried with magnesium sulfate and concentrated under a reduced pressure. The mixture thus obtained was separated by silica gel column chromatography to obtain 7.7 g (yield 69%) of Intermediate 6.

A t-butylbenzene solution (60 ml) including Intermediate 6 (7.7 g) thus obtained was cooled to about −78° C. A t-BuLi/pentane solution (13.8 ml) was added thereto, followed by stirring at about 60° C. for about 2 hours. Then, the solution was cooled to about −35° C., and a 1 M BBr$_3$ heptane solution (22 ml) was added thereto dropwise, followed by stirring at room temperature for about 3 hours. Additionally, the solution was cooled to about −40° C., and diisopropylethylamine (3.8 ml) was added thereto dropwise, followed by heating and stirring at about 165° C. for about 8 hours. The reaction mixture was returned to room temperature and then poured into an aqueous sodium bicarbonate solution. The target material was extracted with ethyl acetate, dried with magnesium sulfate and concentrated under a reduced pressure. The mixture thus obtained was separated by silica gel column chromatography to obtain 1.5 g (yield 20%) of Intermediate 7.

A dichloromethane solution (30 ml) including Intermediate 7 (1.5 g) thus obtained was cooled in ice. 1-chloroethyl chloroformate (0.4 ml) was added thereto dropwise, followed by stirring for about 2 hours at room temperature. After securing the disappearance of the raw material, the solvents were distilled off. MeOH (30 ml) was added thereto, followed by heating and refluxing for about 1 hour. The mixture thus obtained was separated by silica gel column chromatography to obtain 0.5 g (yield 58%) of Intermediate 8.

A toluene solution (10 ml) including intermediate 8 (0.5 g) thus obtained, Intermediate 10 (0.3 g) separately prepared, sodium butoxide (0.2 g), Pd$_2$(dba)$_3$ (0.02 g) and PH(tBu)$_3$/BF$_4$ (0.03 g) was heated and refluxed under heating conditions in an oil bath for about 4 hours. After cooling to room temperature, the reaction solution was poured into water. The target material was extracted with ethyl acetate, dried with magnesium sulfate and concentrated under a reduced pressure. The mixture thus obtained was separated by silica gel column chromatography to obtain 0.56 (yield 80%) of target product A-1. In addition, the molecular weight of the target product was found 817 by FAB-MS measurement. Compound A-1 thus obtained was separated by sublimation and was used as a specimen for evaluation.

(Synthetic Example of Compound A-2)

The polycyclic compound according to an embodiment, Compound A-2, may be synthesized according to the following Reaction:

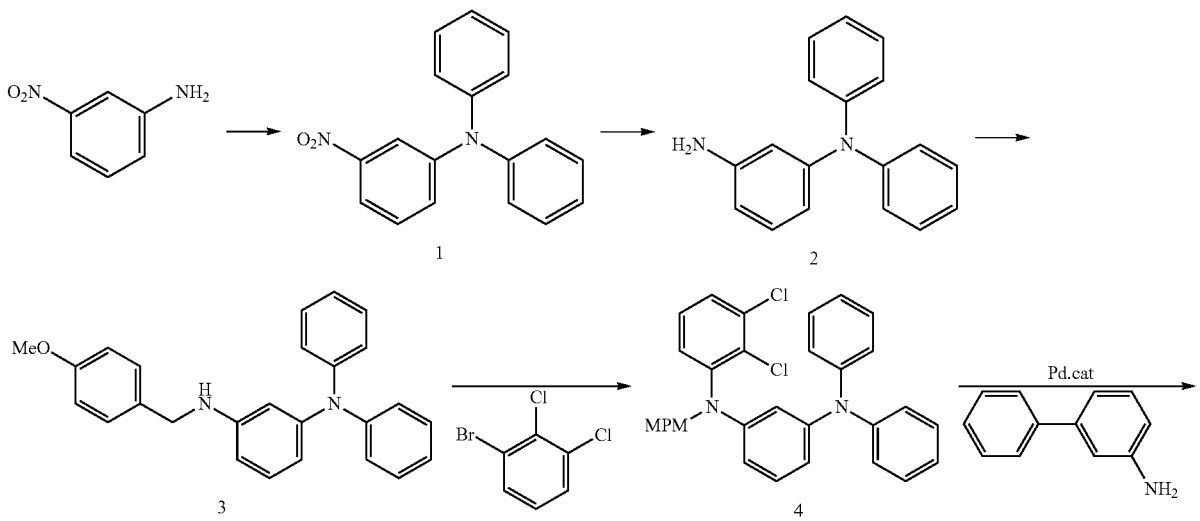

-continued

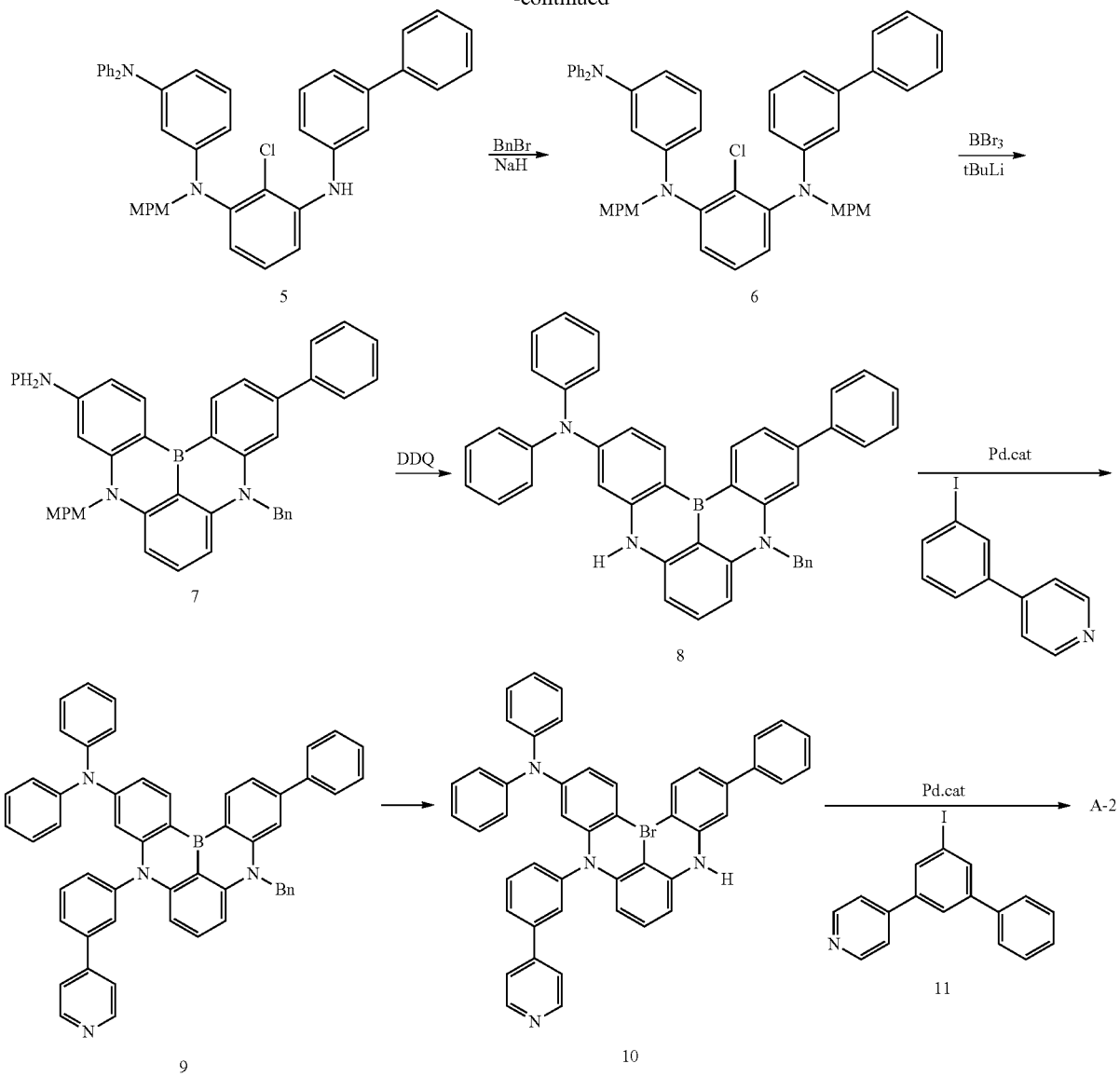

The same procedure as in the method of synthesizing Compound A-1 was carried out until preparing Intermediate 2.

To an acetonitrile solution (500 ml) including Intermediate 2 (40 g), 4-methoxybenzyl bromide (37.1 g) and DIPEA (25.8 g) were added, followed by heating and refluxing under heating conditions in an oil bath for about 1 hour. The reaction solution was cooled to room temperature and poured into water. The target material was extracted with dichloromethane, dried with magnesium sulfate and concentrated under a reduced pressure. The mixture thus obtained was separated by silica gel column chromatography to obtain 47 g (yield 80%) of Intermediate 3.

A toluene solution (350 ml) including Intermediate 3 (47 g) thus obtained, 1-bromo-2,3-dichlorobenzene (29.3 g), sodium butoxide (17.8 g), Pd$_2$(dba)$_3$ (3.2 g) and PH(tBu)$_3$/BF$_4$ (4.1 g) was heated and refluxed under heating conditions in an oil bath for about 3 hours. After cooling to room temperature, the reaction solution was poured into water. The target material was extracted with toluene, dried with magnesium sulfate and concentrated under a reduced pressure. The mixture thus obtained was separated by silica gel column chromatography to obtain 58 g (yield 90%) of Intermediate 4.

A toluene solution (50 ml) including Intermediate 4 (7.3 g) thus obtained, 3-aminobiphenyl (2.3 g), sodium butoxide (2.4 g), Pd$_2$(dba)$_3$ (0.22 g) and PH(tBu)$_3$/BF$_4$ (0.29 g) was heated and refluxed under heating conditions in an oil bath for about 4 hours. After cooling to room temperature, the reaction solution was poured into water. The target material was extracted with ethyl acetate, dried with magnesium sulfate and concentrated under a reduced pressure. The mixture thus obtained was separated by silica gel column chromatography to obtain 8.2 g (yield 90%) of Intermediate 5.

A DMF solution (75 ml) including Intermediate 5 (8.2 g) thus obtained and NaH (0.7 g) was cooled in ice. Benzyl bromide (2.1 ml) was added thereto, followed by stirring for about 2 hours in ice. After securing the disappearance of the raw material by TLC, the reaction solution was poured into water. The target material was extracted with toluene, dried with magnesium sulfate and concentrated under a reduced pressure. The mixture thus obtained was separated by silica gel column chromatography to obtain 7 g (yield 75%) of Intermediate 6.

A t-butylbenzene solution (60 ml) including Intermediate 6 (7 g) thus obtained was cooled to about −78° C. A t-BuLi/pentane solution (13.8 ml) was added thereto, followed by stirring at about 60° C. for about 2 hours. Then, the solution was cooled to about −35° C., and a 1 M BBr$_3$ heptane solution (22 ml) was added thereto dropwise, followed by stirring at room temperature for about 3 hours. Additionally, the solution was cooled to about −40° C., and diisopropylethylamine (3.8 ml) was added thereto dropwise, followed by heating and stirring at about 165° C. for about 8 hours. The reaction mixture was returned to room temperature and then poured into an aqueous sodium bicarbonate solution. The target material was extracted with ethyl acetate, dried with magnesium sulfate and concentrated under a reduced pressure. The mixture thus obtained was separated by silica gel column chromatography to obtain 1.9 g (yield 28%) of Intermediate 7.

A mixture solvent (30 ml) of dichloromethane-water (20:1) including Intermediate 7 (1.9 g) thus obtained was cooled in ice. DDQ (1.1 eq) was added thereto, followed by stirring for about 2 hours at room temperature. After securing the disappearance of the raw material, the reaction solution was poured into water. The target material was extracted with dichloromethane, dried with magnesium sulfate and concentrated under a reduced pressure. The mixture thus obtained was separated by silica gel column chromatography to obtain 1.35 g (yield 85%) of Intermediate 8 which is a target material.

A toluene solution (20 ml) including intermediate 8 (1.35 g) thus obtained, 4-(3-iodophenyl)pyridine (0.76 g), sodium butoxide (0.33 g), Pd$_2$(dba)$_3$ (0.04 g) and PH(tBu)$_3$/BF$_4$ (0.06 g) was heated and refluxed under heating conditions in an oil bath for about 4 hours. After cooling to room temperature, the reaction solution was poured into water. The target material was extracted with ethyl acetate, dried with magnesium sulfate and concentrated under reduced pressure. The mixture thus obtained was separated by silica gel column chromatography to obtain 1.36 (yield 80%) of Intermediate 9 which is a target material.

A dichloromethane solution (30 ml) including Intermediate 9 (1.36 g) thus obtained was cooled in ice, and 1-chloroethyl chloroformate (0.4 ml) was added thereto dropwise. After stirring at room temperature for about 2 hours, the disappearance of the raw material was secured, and solvents were distilled of. MeOH (30 ml) was added thereto, followed by heating and refluxing for about 1 hour. The mixture thus obtained was separated by silica gel column chromatography to obtain 0.84 g (yield 70%) of Intermediate 10.

A toluene solution (10 ml) including intermediate 10 (0.84 g) thus obtained, Intermediate 11 (0.54 g) separately prepared, sodium butoxide (0.2 g), Pd$_2$(dba)$_3$ (0.02 g) and PH(tBu)$_3$/BF$_4$ (0.03 g) was heated and refluxed under heating conditions in an oil bath for about 4 hours. After cooling to room temperature, the reaction solution was poured into water. The target material was extracted with ethyl acetate, dried with magnesium sulfate and concentrated under a reduced pressure. The mixture thus obtained was separated by silica gel column chromatography to obtain 0.86 g (yield 76%) of target material, A-2. In addition, the molecular weight of the target material was found 893 by FAB-MS measurement. Compound A-2 thus obtained was separated by sublimation and was used as a specimen for evaluation.

In addition, from the emission spectrum measurement of a device, the half-width of Compound A-2 was supposed to be about 65 nm.

(Synthetic Example of Compound A-3)

The polycyclic compound according to an embodiment, Compound A-3, may be synthesized according to the following Reaction:

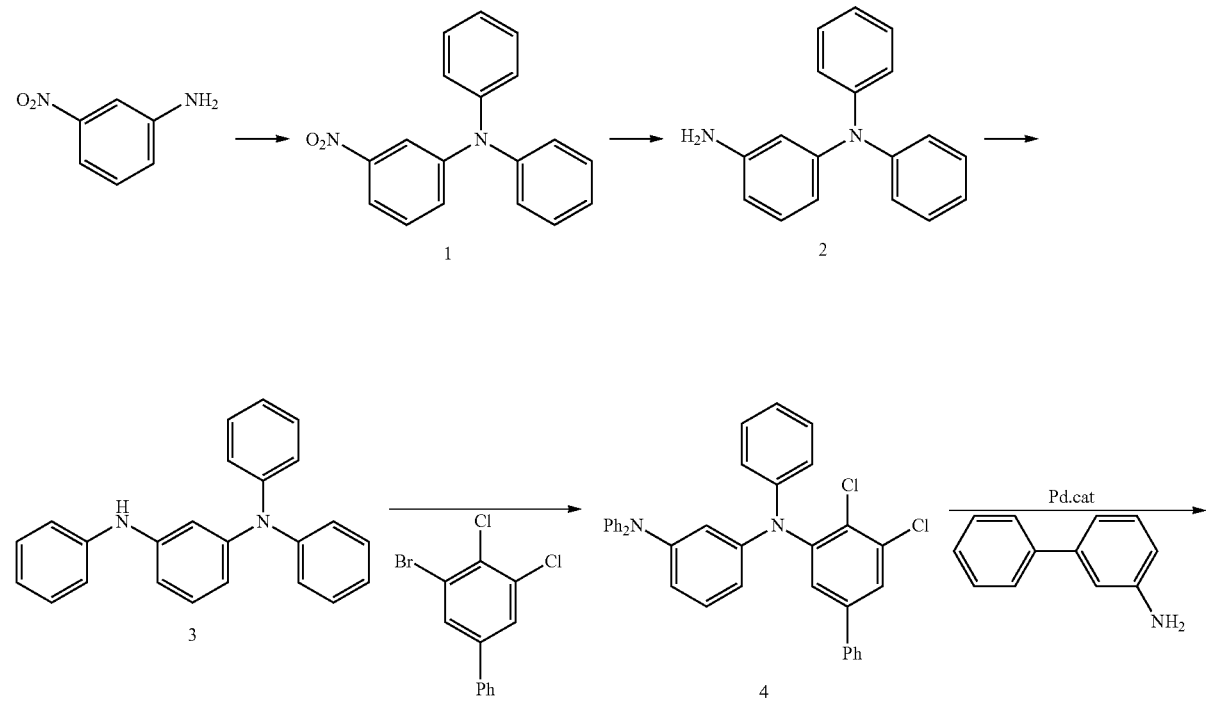

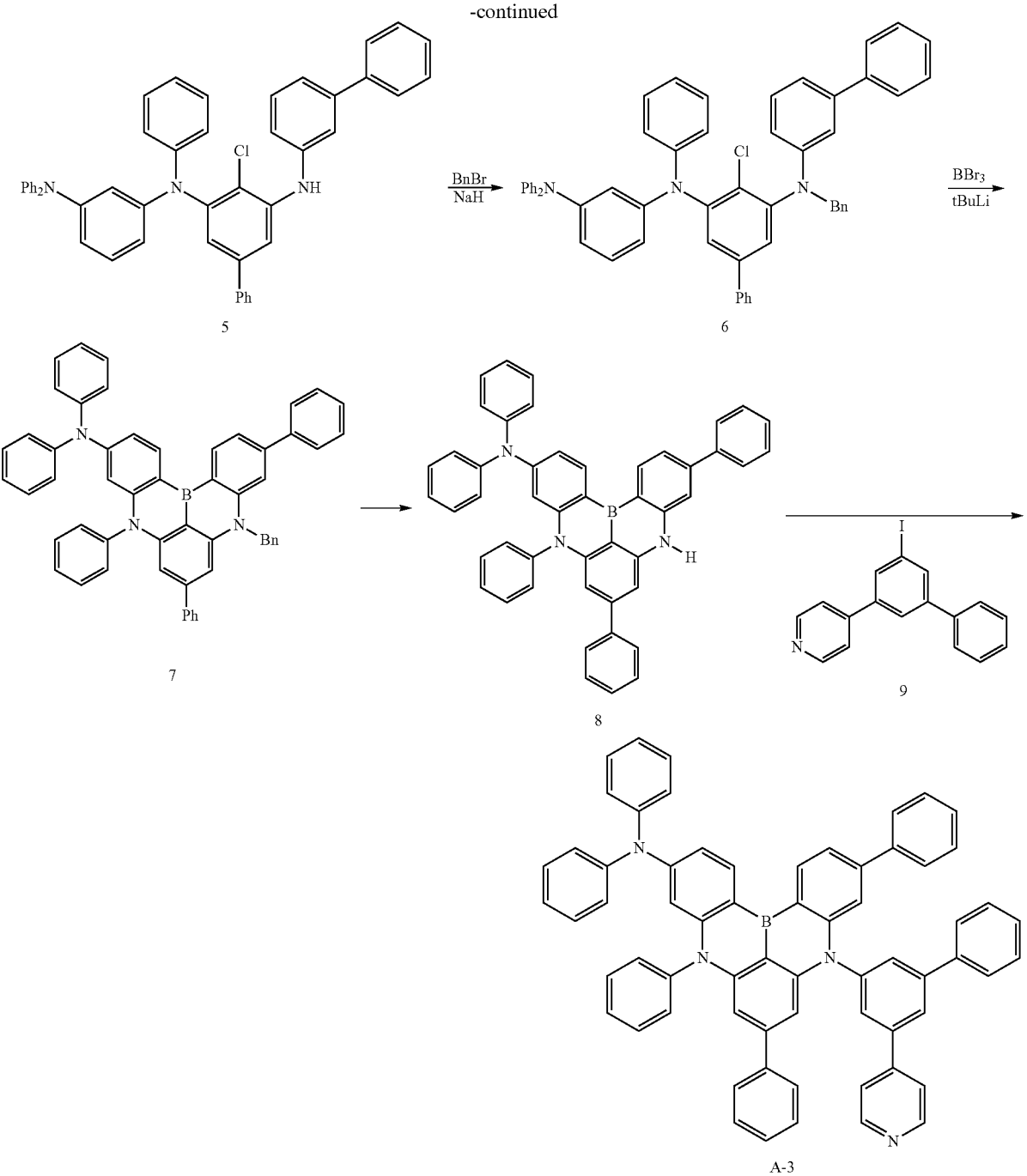

The same procedure as in the method of synthesizing Compound A-1 was carried out until preparing Intermediate 3.

A toluene solution (350 ml) including Intermediate 3 (52 g) thus obtained, 1-bromo-2,3-dichlorobenzene (47 g), sodium butoxide (34 g), Pd$_2$(dba)$_3$ (3.2 g) and PH(tBu)$_3$/BF$_4$ (4.1 g) was heated and refluxed under heating conditions in an oil bath for about 3 hours. After cooling to room temperature, the reaction solution was poured into water. The target material was extracted with toluene, dried with magnesium sulfate and concentrated under a reduced pressure. The mixture thus obtained was separated by silica gel column chromatography to obtain 78 g (yield 90%) of Intermediate 4.

A toluene solution (50 ml) including Intermediate 4 (7.8 g) thus obtained, 3-aminobiphenyl (2.3 g), sodium butoxide (2.4 g), Pd$_2$(dba)$_3$ (0.22 g) and PH(tBu)$_3$/BF$_4$ (0.29 g) was heated and refluxed under heating conditions in an oil bath for about 4 hours. After cooling to room temperature, the reaction solution was poured into water. The target material was extracted with ethyl acetate, dried with magnesium sulfate and concentrated under a reduced pressure. The mixture thus obtained was separated by silica gel column chromatography to obtain 8.2 g (yield 85%) of Intermediate 5.

A DMF solution (75 ml) including Intermediate 5 (8.2 g) thus obtained and NaH (0.7 g) was cooled in ice. Benzyl bromide (2 ml) was added thereto, followed by stirring for about 2 hours in ice. After securing the disappearance of the raw material by TLC, the reaction solution was poured into water. The target material was extracted with toluene, dried with magnesium sulfate and concentrated under reduced pressure. The mixture thus obtained was separated by silica gel column chromatography to obtain 6.5 g (yield 70%) of Intermediate 6.

A t-butylbenzene solution (60 ml) including Intermediate 6 (6.5 g) thus obtained was cooled to about −78° C. A t-BuLi/pentane solution (13.8 ml) was added thereto, followed by stirring at about 60° C. for about 2 hours. Then, the solution was cooled to about −35° C., and a 1 M $BBr_3$ heptane solution (22 ml) was added thereto dropwise, followed by stirring at room temperature for about 3 hours. Additionally, the solution was cooled to about −40° C., and diisopropylethylamine (3.8 ml) was added thereto dropwise, followed by heating and stirring at about 165° C. for about 8 hours. The reaction mixture was returned to room temperature and then poured into an aqueous sodium bicarbonate solution. The target material was extracted with ethyl acetate, dried with magnesium sulfate and concentrated under a reduced pressure. The mixture thus obtained was separated by silica gel column chromatography to obtain 1.6 g (yield 25%) of Intermediate 7.

A dichloromethane solution (30 ml) including Intermediate 7 (1.6 g) thus obtained was cooled in ice. 1-chloroethyl chloroformate (0.4 ml) was added thereto dropwise, followed by stirring for about 2 hours at room temperature. After securing the disappearance of the raw material, and the solvents were distilled off. MeOH (30 ml) was added thereto, followed by heating and refluxing for about 1 hour. The mixture thus obtained was separated by silica gel column chromatography to obtain 0.9 g (yield 65%) of Intermediate 8.

A toluene solution (10 ml) including intermediate 8 (0.9 g) thus obtained, Intermediate 9 (0.3 g) separately prepared, sodium butoxide (0.2 g), $Pd_2(dba)_3$ (0.02 g) and $PH(tBu)_3/BF_4$ (0.03 g) was heated and refluxed under heating conditions in an oil bath for about 4 hours. After cooling to room temperature, the reaction solution was poured into water. The target material was extracted with ethyl acetate, dried with magnesium sulfate and concentrated under a reduced pressure. The mixture thus obtained was separated by silica gel column chromatography to obtain 0.91 g (yield 75%) of a target material, A-3. In addition, the molecular weight of the target material was found 892 by FAB-MS measurement. The compound thus obtained was separated by sublimation and was used as a specimen for evaluation.

In addition, from the emission spectrum measurement of a device, the half-width of Compound A-3 was supposed to be about 58 nm.

1. Manufacture and Evaluation of Organic Electroluminescence Device Including a Polycyclic Compound (Manufacture of Organic Electroluminescence Devices)

Organic electroluminescence devices of exemplary embodiments including the polycyclic compounds of exemplary embodiments in emission layers were manufactured by a method described below. Organic electroluminescence devices of Examples 1 to 3 were manufactured using the polycyclic compounds of Compound A-1, Compound A-2, and Compound A-3 as materials for an emission layer.

Compounds used in the emission layer in Examples 1 to 3 and Comparative Examples 1 to 5 are shown below.

[Example Compound]

A-1

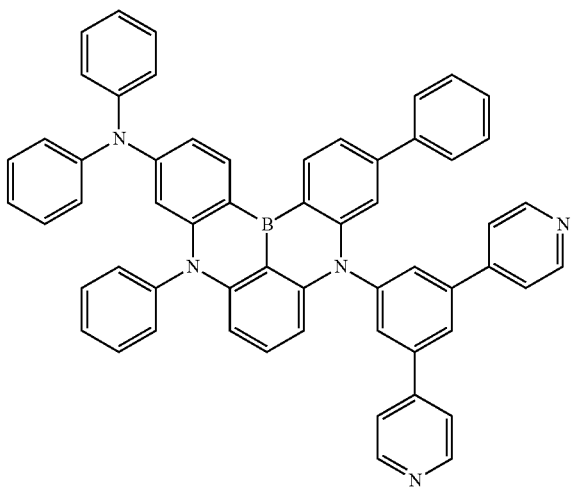

A-2

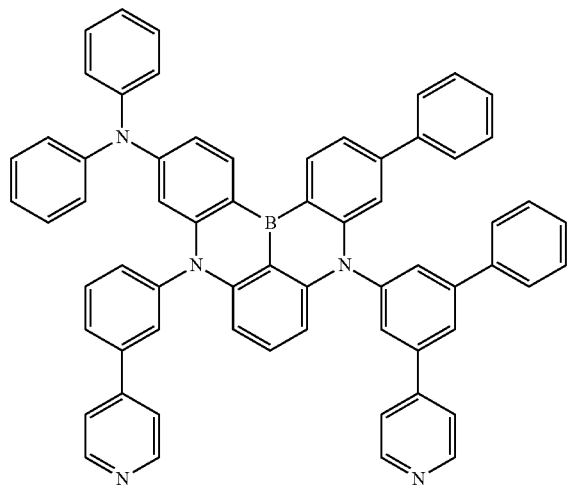

A-3

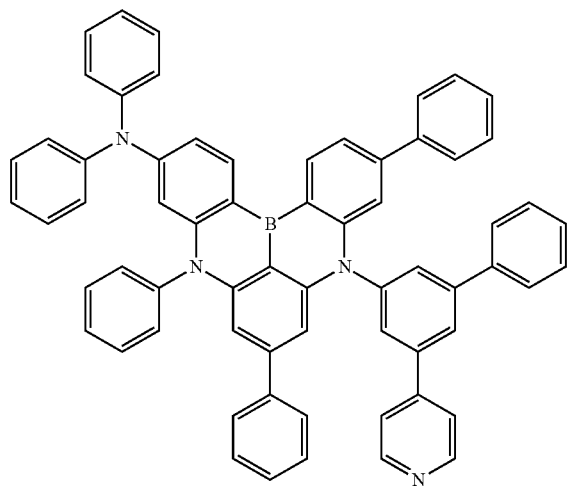

[Comparative Compound]

X-1
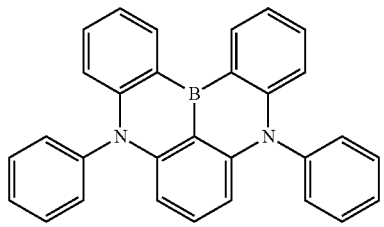

X-2
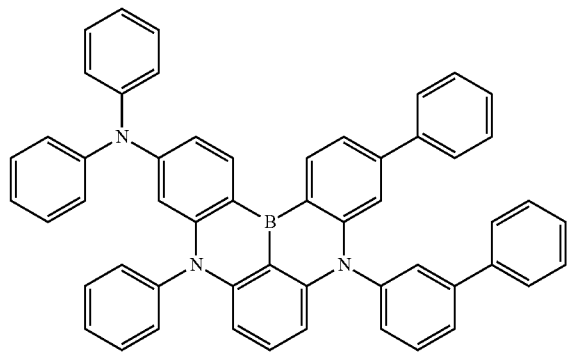

X-3
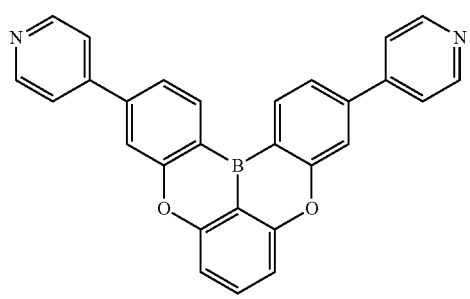

X-4
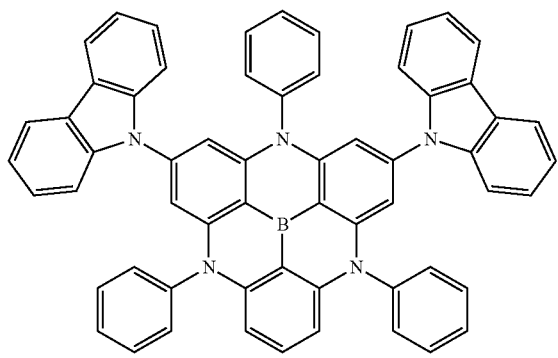

X-5
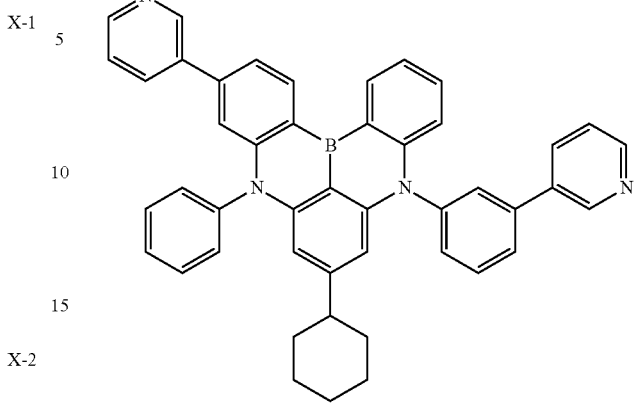

The organic electroluminescence devices of the Examples and the Comparative Examples were manufactured by a method described below.

On a glass substrate, ITO with a thickness of about 1,500 Å was patterned and washed with ultra-pure water, and a UV ozone treatment was conducted for about 10 minutes. Then, HAT-CN was deposited to a thickness of about 100 Å, α-NPD was deposited to a thickness of about 800 Å, and mCP was deposited to a thickness of about 50 Å to form a hole transport region.

Then, each of the polycyclic compounds of embodiments and the Comparative Compounds, and DPEPO were co-deposited in a ratio of 6:94 to form an emission layer to a thickness of about 200 Å. Then, a layer with a thickness of about 100 Å was formed using DPEPO. That is, in order to form the emission layer by the co-deposition, each of Compounds A-1, A-2, and A-3 was mixed with DPEPO and deposited in Examples 1 to 3, and each of Comparative Compounds X-1, X-2, X-3, X-4 and X-5 was mixed with DPEPO and deposited in Comparative Examples 1 to 4.

On the emission layer, a layer was formed using TPBi to a thickness of about 300 Å, and a layer was formed using LiF to a thickness of about 5 Å to form an electron transport region. Then, a second electrode was formed using aluminum (Al) to a thickness of about 1,000 Å.

In the examples, the hole transport region, the emission layer, the electron transport region and the second electrode were formed by using a vacuum deposition apparatus.

(Evaluation of Properties of Organic Electroluminescence Device)

In order to evaluate the properties of the organic electroluminescence devices of the Examples and the Comparative Examples, the maximum emission wavelength (nm), and external quantum yield (%) were evaluated. The measurement was conducted using a luminous brightness measurement apparatus, C9920-11 of HAMAMATSU Photonics Co.

TABLE 1

| Division | Emission layer dopant | Half-width | $k_{RTSC}$ (s$^{-1}$) | Device life |
|---|---|---|---|---|
| Example 1 | A-1 | 55 nm | 5.1 × 10$^4$ | 147% |
| Example 2 | A-2 | 65 nm | 4.3 × 10$^4$ | 138% |
| Example 3 | A-3 | 58 nm | 3.9 × 10$^4$ | 135% |
| Comparative Example 1 | Comparative Compound X-1 | 28 nm | 9.9 × 10$^3$ | 100% |

TABLE 1-continued

| Division | Emission layer dopant | Half-width | $k_{RTSC}$ (s$^{-1}$) | Device life |
|---|---|---|---|---|
| Comparative Example 2 | Comparative Compound X-2 | 28 nm | $1.4 \times 10^4$ | 118% |
| Comparative Example 3 | Comparative Compound X-3 | 40 nm | $8.5 \times 10^3$ | 93% |
| Comparative Example 4 | Comparative Compound X-4 | 23 nm | $2.8 \times 10^4$ | 128% |
| Comparative Example 5 | Comparative Compound X-5 | 30 nm | $3.5 \times 10^4$ | 120% |

Referring to Table 1, the organic electroluminescence devices of Example 1 to Example 3, which used the polycyclic compound of an embodiment as a dopant material of an emission layer showed greater RISC rate constant ($k_{RTSC}$) when compared with Comparative Example 1 to Comparative Example 4. In addition, it was found that the organic electroluminescence devices of Example 1 to Example 3, which used the polycyclic compound of an embodiment as a dopant material of an emission layer showed increased device life when compared with Comparative Example 1 to Comparative Example 4.

It was found that the polycyclic compound of an embodiment had a half-width of from about 30 nm to about 100 nm, preferably, from about 50 nm to about 70 nm and had a charge separated structure of HOMO-LUMO in a molecule. Accordingly, RISC rate was increased and the life of a device was increased, and accordingly, the polycyclic compound might be used as a material for thermally activated delayed fluorescence.

The organic electroluminescence device of an embodiment includes the polycyclic compound of an embodiment in an emission layer, and may improve the half-width and RISC rate constant ($k_{RTSC}$), thereby increasing the life of the device.

When compared with the Examples, Comparative Compounds X-1 and X-2 did not include a bonded shape of an electron donor with an electron acceptor. Accordingly, the organic electroluminescence devices of Comparative Examples 1 and 2 had smaller half-widths and RISC rate constants ($k_{RTSC}$) than the Examples, and the life of the devices was relatively low.

Comparative Compound X-3 used in Comparative Example 3 included a pyridine group as an electron acceptor, but the organic electroluminescence device of Comparative Example 3 showed lower external quantum efficiency than the Examples. This is thought because Comparative Compound X-3 included an electron donor including O—B—O, and thus, multiple resonance effect occurred and delocalization in a molecule was not achieved well.

Comparative Compound X-4 which was used in Comparative Example 4 had a condensed shape of three rings forming with N—B, and the organic electroluminescence device of Comparative Example 4 had a smaller half-width and RISC rate constant ($k_{RTSC}$) when compared with the Examples, and thus, the life of the device was relatively low.

In addition, the organic electroluminescence device of Comparative Example 5 had a smaller half-width and RISC rate constant ($k_{RTSC}$), when compared with the Examples, and thus, the life of the device was relatively low. It is thought that Comparative Compound X-5 used in Comparative Example 5 included a cyclic alkyl group as a substituent, and the delocalization of electrons in a molecule was not achieved well.

The organic electroluminescence device according to an embodiment of the inventive concept may attain high efficiency and long life.

The polycyclic compound according to an embodiment of the inventive concept may improve the life and efficiency of an organic electroluminescence device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof, and
wherein,
the emission layer comprises a polycyclic compound represented by Formula 2:

[Formula 2]

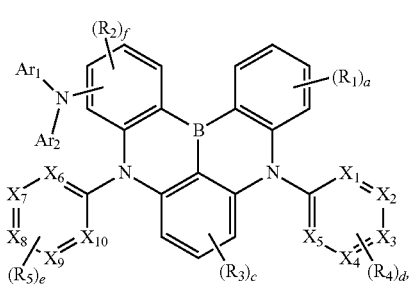

and in Formula 2,
Ar$_1$ and Ar$_2$ are each independently a phenyl group,
X$_1$ to X$_{10}$ are each carbon,
R$_1$ is a phenyl group,
R$_2$ is a hydrogen atom,
R$_3$ is a hydrogen atom,
R$_4$ is a pyridine group,
R$_5$ is a hydrogen atom,
e is 5,
f is 3,
a is 1,
c is 3, and
d is 2 and one R$_4$ is bonded to X$_2$ and another R$_4$ is bonded to X$_4$.

2. The organic electroluminescence device of claim 1, wherein the emission layer is for emitting delayed fluorescence.

3. The organic electroluminescence device of claim 1, wherein the emission layer is a delayed fluorescence emission layer comprising a host and a dopant, and
the dopant comprises the polycyclic compound.

4. The organic electroluminescence device of claim 3, wherein the dopant further comprises a styryl derivative, perylene, a perylene derivative, pyrene, and/or a pyrene derivative.

5. The organic electroluminescence device of claim 1, wherein the emission layer is a thermally activated delayed fluorescence emission layer for emitting blue light.

6. The organic electroluminescence device of claim 1, wherein the polycyclic compound is any one among compounds represented in Compound Group 1:

[Compound Group 1]

A-1

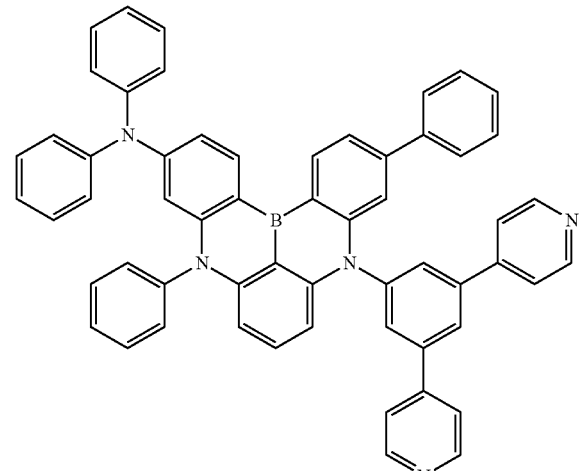

A-7

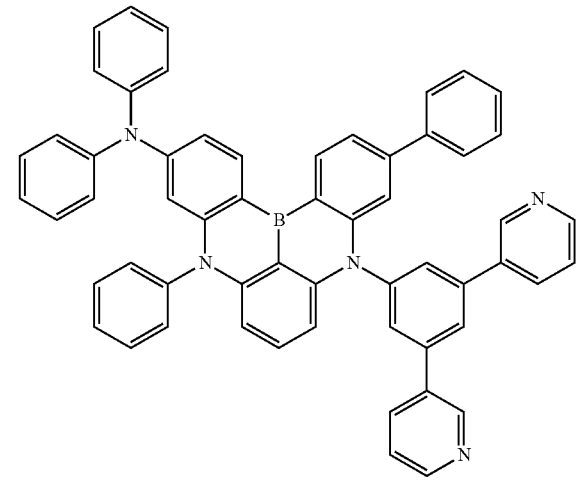

-continued

A-13

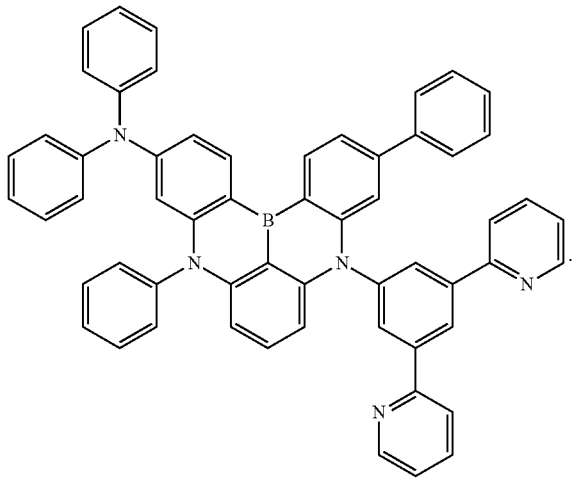

7. A polycyclic compound represented by Formula 2:

[Formula 2]

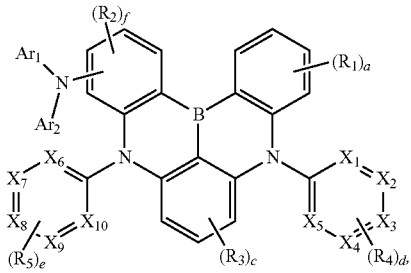

in Formula 2,
Ar$_1$ and Ar$_2$ are each independently a phenyl group,
X$_1$ to X$_{10}$ are each carbon,
R$_1$ is a phenyl group,
R$_2$ is a hydrogen atom,
R$_3$ is a hydrogen atom,
R$_4$ is a pyridine group,
R$_5$ is a hydrogen atom,
e is 5,
f is 3,
a is 1,
c is 3, and
d is 2 and one R$_4$ is bonded to X$_2$ and another R$_4$ is bonded to X$_4$.

* * * * *

UNITED STATES PATENT AND TRADEMARK OFFICE
CERTIFICATE OF CORRECTION

PATENT NO. : 12,133,454 B2
APPLICATION NO. : 16/575334
DATED : October 29, 2024
INVENTOR(S) : Tetsuji Hayano Page 1 of 1

It is certified that error appears in the above-identified patent and that said Letters Patent is hereby corrected as shown below:

In the Claims

In Column 48, Line 26, in Claim 1, delete "LiF/AI," and insert -- LiF/Al, --.

Signed and Sealed this
Eighth Day of July, 2025

Coke Morgan Stewart
*Acting Director of the United States Patent and Trademark Office*